United States Patent
Tsai et al.

(10) Patent No.: US 9,984,898 B2
(45) Date of Patent: May 29, 2018

(54) SUBSTRATE, SEMICONDUCTOR PACKAGE INCLUDING THE SAME, AND METHOD FOR MANUFACTURING THE SAME

(71) Applicant: Advanced Semiconductor Engineering, Inc., Kaohsiung (TW)

(72) Inventors: Li Chuan Tsai, Kaohsiung (TW); Chih-Cheng Lee, Kaohsiung (TW); Cheng-Lin Ho, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days. days.

(21) Appl. No.: 15/630,847

(22) Filed: Jun. 22, 2017

(65) Prior Publication Data

US 2018/0005846 A1    Jan. 4, 2018

Related U.S. Application Data

(60) Provisional application No. 62/356,447, filed on Jun. 29, 2016.

(51) Int. Cl.
| | |
|---|---|
| *H01L 21/48* | (2006.01) |
| *H01L 23/31* | (2006.01) |
| *H01L 23/498* | (2006.01) |
| *H01L 21/56* | (2006.01) |
| *H01L 21/683* | (2006.01) |
| *H01L 23/00* | (2006.01) |

(52) U.S. Cl.
CPC ........ *H01L 21/4857* (2013.01); *H01L 21/563* (2013.01); *H01L 21/6835* (2013.01); *H01L 23/3128* (2013.01); *H01L 23/498* (2013.01); *H01L 24/16* (2013.01)

(58) Field of Classification Search
CPC . H01L 21/4857; H01L 24/16; H01L 21/6835; H01L 23/498; H01L 23/3128; H01L 21/563
See application file for complete search history.

(56) References Cited

U.S. PATENT DOCUMENTS 9,485,874 B2 *  11/2016  Chen ................... H05K 3/4038
2015/0016082 A1   1/2015  Lee

* cited by examiner

*Primary Examiner* — David Vu
(74) *Attorney, Agent, or Firm* — Foley & Lardner LLP; Cliff Z. Liu

(57) ABSTRACT

A substrate includes a dielectric layer having a first surface and a second surface opposite to the first surface, a first circuit layer and at least one second conductive element. The first circuit layer is disposed adjacent to the first surface of the dielectric layer, and includes at least one trace and at least one first conductive element connected to the trace. The first conductive element does not extend through the dielectric layer. The second conductive element extends through the dielectric layer. An area of an upper surface of the second conductive element is substantially equal to an area of an upper surface of the first conductive element.

32 Claims, 18 Drawing Sheets

SUBSTRATE, SEMICONDUCTOR PACKAGE INCLUDING THE SAME, AND METHOD FOR MANUFACTURING THE SAME

CROSS-REFERENCE TO RELATED APPLICATIONS

This application claims the benefit of and priority to U.S. Provisional Patent Application 62/356,447, filed Jun. 29, 2016, which is incorporated herein by reference in its entirety.

BACKGROUND

1. Field of the Disclosure

The present disclosure relates to a substrate, a semiconductor package and a manufacturing method, and more particularly to a substrate including first and second conductive elements having a substantially same area of upper surfaces, a semiconductor package including the substrate, and a method for manufacturing the substrate.

2. Description of the Related Art

In a semiconductor package, a conductive via is included for electrical connection between opposite surfaces of a substrate. For example, a substrate may include a first circuit layer on a first surface and a second circuit layer on a second surface. The first circuit layer may include a bump pad, a via extending through the substrate, and a trace connecting the bump pad and the via. When a semiconductor die is connected to the first surface of the substrate, the semiconductor die may be connected to the bump pad of the first circuit, such that electrical signals can be transmitted sequentially through the bump pad, the trace and the via to the second circuit on the second surface. However, the arrangement of the bump pad, the trace and the via forms a long path through which the electrical signals are transmitted, and occupies a large area of the first surface of the substrate.

SUMMARY

In some embodiments, a substrate includes a dielectric layer having a first surface and a second surface opposite to the first surface, a first circuit layer and at least one second conductive element. The first circuit layer is disposed adjacent to the first surface of the dielectric layer, and includes at least one trace and at least one first conductive element connected to the trace. The first conductive element does not extend through the dielectric layer. The second conductive element extends through the dielectric layer. An area of an upper surface of the second conductive element is substantially equal to an area of an upper surface of the first conductive element.

In some embodiments, a semiconductor package includes a substrate, a die and an encapsulant. The substrate includes a dielectric layer having a first surface and a second surface opposite to the first surface, a first circuit layer and at least one second conductive element. The first circuit layer is disposed adjacent to the first surface of the dielectric layer, and includes at least one trace and at least one first conductive element connected to the trace. The first conductive element does not extend through the dielectric layer. The second conductive element extends through the dielectric layer. An area of an upper surface of the second conductive element is substantially equal to an area of an upper surface of the first conductive element. The die includes a plurality of connecting elements. At least one of the connecting elements is electrically connected to the first conductive element, and at least another one of the connecting elements is electrically connected to the second conductive element. The encapsulant covers the die and the substrate.

In some embodiments, a method for manufacturing a substrate includes providing a first circuit layer including a trace and a first conductive element connected to the trace; providing a dielectric layer having a first surface and a second surface opposite to the first surface and covering the first circuit layer, wherein the first circuit layer is disposed adjacent to the first surface of the dielectric layer; providing a mask layer on the second surface of the dielectric layer, wherein the mask layer defines a plurality of openings; forming a plurality of through holes in the dielectric layer corresponding to the openings of the mask layer by laser drilling; and filling the through holes of the dielectric layer with a conductive material and disposing a second circuit layer on the second surface of the dielectric layer.

In some embodiments, a method for manufacturing a substrate includes providing a first circuit layer including a trace and a first conductive element connected to the trace; providing a dielectric layer having a first surface and a second surface opposite to the first surface and covering the first circuit layer, wherein the first circuit layer is disposed adjacent to the first surface of the dielectric layer, and the dielectric layer is made of a photo-imageable material; forming a plurality of through holes of the dielectric layer by a lithography technique, wherein each of the plurality of through holes includes an upper portion adjacent to the first surface of the dielectric layer, and an area of a cross section of the upper portion is substantially equal to an area of an upper surface of the first conductive element; and filling the through holes with a conductive material and disposing a second circuit layer on the second surface of the dielectric layer.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
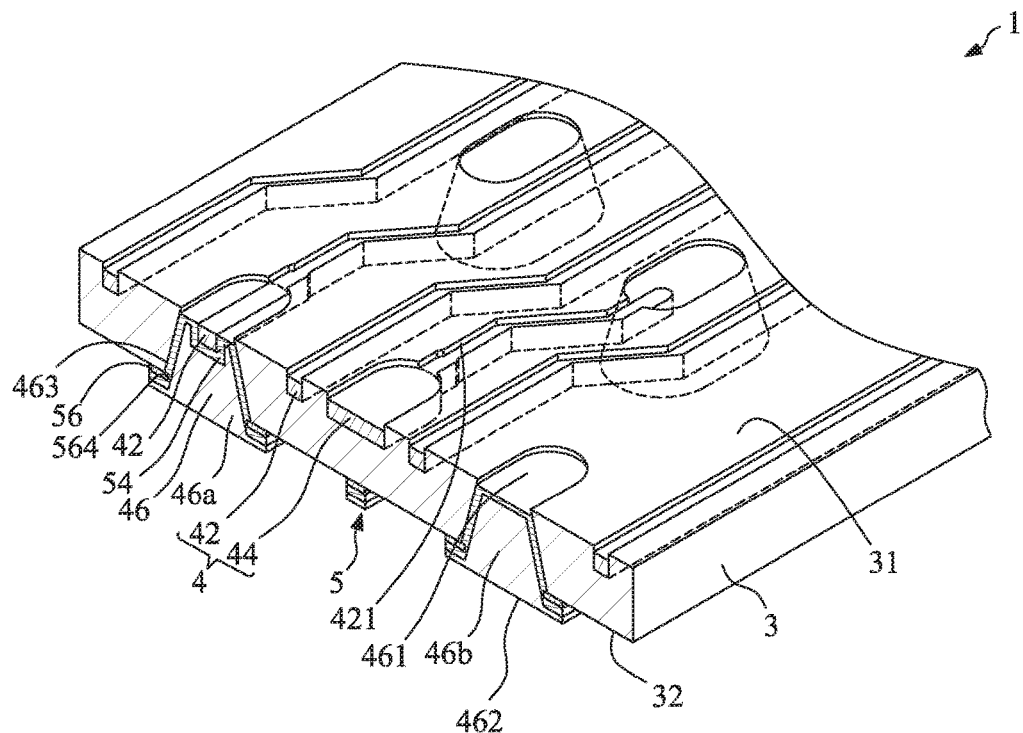
FIG. 1 illustrates a perspective view of an example of a substrate in which a first protective layer and a second protective layer are omitted according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure disclose a substrate including a first conductive element not extending through a dielectric layer, and a second conductive element extending through the dielectric layer, with an area of an upper surface of the second conductive element substantially equal to an area of an upper surface of the first conductive element. At least some embodiments of the present disclosure further disclose a semiconductor package including the substrate, and techniques for manufacturing the substrate.

In a semiconductor package, a conductive via is used for electrical connection between opposite surfaces of a substrate. For example, a substrate may include a first circuit layer on a first surface and a second circuit layer on a second surface. The first circuit layer may include a bump pad, a via extending through the substrate, and a trace connecting the bump pad and the via. When a semiconductor die is connected to the first surface of the substrate, the semiconductor die may be connected to the bump pad of the first circuit, such that electrical signals can be transmitted sequentially through the bump pad, the trace and the via to the second circuit on the second surface. However, the arrangement of the bump pad, the trace and the via forms a long path through which the electrical signals are transmitted, and occupies a large area of the first surface of the substrate.

Hence, an improved semiconductor package includes a semiconductor die directly connected to a via of the substrate, such that electrical signals can be transmitted through a path with a reduced length. For example, the die is connected to both the bump pad and the via. However, in such semiconductor package, an area of an upper surface of the bump pad is not equal to an area of an upper surface of the via. For example, the area of the upper surface of the bump pad is generally smaller than the area of the upper surface of the via. Accordingly, when solders with the same volume are respectively applied on the upper surfaces of the bump pad and the via, wetting behavior of the solders on the bump pad may differ from that on the via, thus resulting in different heights of the solders on the bump pad and the via. Specifically, since the area of the bump pad is relatively smaller, the solder thereon may have a larger height. On the other hand, since the area of upper surface of the via is relatively larger, the solder thereon may have a smaller height. The die, which is connected to both the bump pad and the via, may thus lean downwardly toward the via.

The present disclosure provides a substrate including a first conductive element and a second conductive element to address at least the above concern. In some embodiments, an area of an upper surface of the first conductive element is substantially the same as an area of an upper surface of the second conductive element. Thus, when a die is connected to both the first conductive element and the second conductive element through solders with substantially the same volume, the die can be substantially parallel to the substrate.

Figure 2:
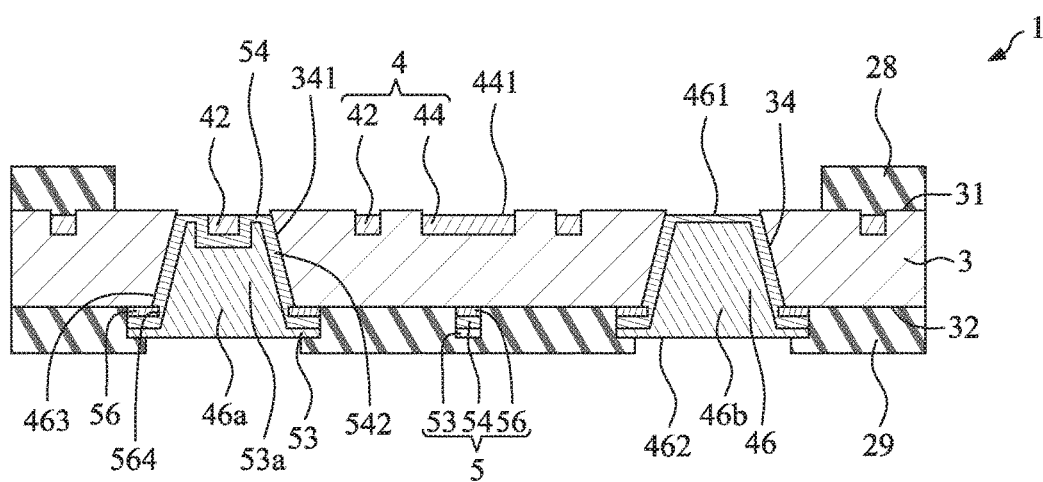
FIG. 2 illustrates a cross-sectional view of the substrate shown in FIG. 1 in which a first protective layer and a second protective layer are included according to some embodiments of the present disclosure.

FIG. 1 illustrates a perspective view of a substrate 1 in which a first protective layer and a second protective layer are omitted according to some embodiments of the present disclosure. FIG. 2 illustrates a cross-sectional view of the substrate 1 shown in FIG. 1 in which a first protective layer and a second protective layer are included according to some embodiments of the present disclosure. The substrate 1 includes a dielectric layer 3, a first circuit layer 4, at least one second conductive element 46, a second circuit layer 5, a first protective layer 28 and a second protective layer 29. For illustration purposes, the first and second protective layers 28 and 29 are not shown in FIG. 1.

The dielectric layer 3 includes a first surface 31 and a second surface 32 opposite to the first surface 31, and defines at least one through hole 34. The through hole 34 extends through the dielectric layer 3. The dielectric layer 3 is made of an insulating material or a dielectric material, such as, for example, polypropylene (PP).

The first circuit layer 4 is disposed adjacent to the first surface 31 of the dielectric layer 3. For example, the first circuit layer 4 is embedded in the dielectric layer 3 and exposed from the first surface 31 of the dielectric layer 3. The first circuit layer 4 is made of a conductive material, such as copper, or another metal or combination of metals, and may be formed or disposed by electroplating. In some embodiments, the first circuit layer 4 is a patterned conductive circuit layer. The first circuit layer 4 includes at least one trace 42 and at least one first conductive element 44. The first conductive element 44 is connected to the trace 42. In some embodiments, the trace 42 and the first conductive element 44 can be formed or disposed concurrently, or can be integrally formed as a monolithic structure. The trace 42 and the first conductive element 44 do not extend through the dielectric layer 3. For example, the first conductive element 44 may be a bump pad that partially extends (without fully extending) through the dielectric layer 3, and a width of the first conductive element 44 may be greater than a width of the trace 42. The first conductive element 44 includes an upper surface 441 adjacent to the first surface 31 of the dielectric layer 3. The upper surface 441 of the first conductive element 44 may be substantially coplanar with the first surface 31 of the dielectric layer 3, or may be slightly lower than, recessed from, or otherwise displaced from the first surface 31 of the dielectric layer 3, as shown in FIGS. 1 and 2 (for example, the upper surface 441 of the first conductive element 44 is recessed from the first surface 31 of the dielectric layer 3). In some embodiments, as shown in FIG. 1, the upper surface 441 of the first conductive element 44 may be in a rounded-rectangular shape (or so-called "long-bar" shape).

The second conductive element 46 extends through the dielectric layer 3. For example, the second conductive element 46 is a conductive via that substantially fully extends through the dielectric layer 3. In other words, the second conductive element 46 may be a "bump pad via" which may serve as a bump pad which can be directly connected to external components. The second conductive element 46 includes a conductive metal 53a, and the material thereof can be the same as or different from the material of the first circuit layer 4. The second conductive element 46 includes an upper surface 461 and a lower surface 462 opposite to the upper surface 461. The upper surface 461 is adjacent to the first surface 31 of the dielectric layer 3, and the lower surface 462 is adjacent to the second surface 32 of the dielectric layer 3. In some embodiments, the upper surface 461 of the second conductive element 46 may also serve as a bump pad. The upper surface 461 of the second conductive element 46 is substantially coplanar with the upper surface 441 of the first conductive element 44. Thus, the upper surface 461 of the second conductive element 46 may be substantially coplanar with the first surface 31 of the dielectric layer 3, or may be slightly lower than, recessed from, or otherwise displaced from the first surface 31 of the dielectric layer 3, as shown in FIGS. 1 and 2 (for example, the upper surface 461 of the second conductive element 46 is recessed from the first surface 31 of the dielectric layer 3). In some embodiments, the second conductive element 46 is a monolithic structure, and the upper surface 461 of the second conductive element 46 is exposed from the first surface 31 of the dielectric layer 3. As can be seen in FIGS. 1 and 2, the second conductive element 46 does not include a via land.

An area of the upper surface 461 of the second conductive element 46 is substantially equal to an area of the upper surface 441 of the first conductive element 44. In some embodiments, a shape and a size of the upper surface 461 of the second conductive element 46 is substantially equal to a shape and a size of the upper surface 441 of the first conductive element 44. For example, as shown in FIG. 1, the upper surface 461 of the second conductive element 46 may also be in a rounded-rectangular shape. In other words, the upper surface 461 of the second conductive element 46 is substantially congruent to the upper surface 441 of the first conductive element 44.

In some embodiments, such as the substrate 1 shown in FIGS. 1 and 2, the at least one second conductive element 46 includes a second conductive element (or a first portion) 46a that is connected to the trace 42 of the first circuit layer 4. In some embodiments, the at least one second conductive element 46 includes a second conductive element (or a second portion) 46b that is not connected to the trace 42 of the first circuit layer 4. Accordingly, the at least one trace 42 of the first circuit layer 4 may include a trace 42 having an end connected to the first conductive element 44 and another end connected to the second conductive element 46, such as the second conductive element 46a shown in FIGS. 1 and 2.

The second conductive element 46 includes a maximum portion 463 adjacent to the second surface 32 of the dielectric layer 3. The maximum portion 463 of the second conductive element 46 is connected to the second circuit layer 5. A shape of a cross section of the maximum portion 463 of the second conductive element 46 is similar to the shape of the upper surface 441 of the first conductive element 44, but the size of the cross section of the maximum portion 463 of the second conductive element 46 is greater than the size of the upper surface 441 of the first conductive element 44. Accordingly, the size of the upper surface 461 of the second conductive element 46 is smaller than the size of the cross section of the maximum portion 463 of the second conductive element 46.

Referring to FIGS. 1 and 2, the second circuit layer 5 is disposed on the second surface 32 of the dielectric layer 3. In some embodiments, the second circuit layer 5 is integrally formed or disposed with and connected to the second conductive element 46. The second circuit layer 5 includes a patterned metal layer 53, a seed layer 54 and a mask layer 56. The patterned metal layer 53 may include, for example or another metal or combination of metals, copper, and may be formed or disposed by electroplating. The seed layer 54 may include, for example, titanium and/or copper, and may be formed or disposed by sputtering. The mask layer 56 may include, for example, copper or another metal or combination of metals, and may be formed or disposed by a lithography technique. The seed layer 54 and the mask layer 56 are interposed between the patterned metal layer 53 and the dielectric layer 3. For example, the mask layer 56 is disposed on the second surface 32 of the dielectric layer 3, the seed layer 54 is disposed on the mask layer 56, and the patterned metal layer 53 is disposed on the seed layer 54.

The mask layer 56 contacts the dielectric layer 3 and defines at least one opening 564. A shape of the opening 564 is similar to a shape of the maximum portion 463 of the second conductive element 46. However, a size of the opening 564 is smaller than the size of a maximum portion 463 of the second conductive element 46. The seed layer 54 includes a portion 542 disposed on a sidewall 341 of the through hole 34. In some embodiments, the portion 542 of the seed layer 54 is included in the second conductive element 46. Thus, the second conductive element 46 includes the portion 542 of the seed layer 54 and the conductive metal 53a disposed on the portion 542 of the seed layer 54 in the through hole 34. In some embodiments, the conductive metal 53a and the patterned metal layer 53 are formed or disposed integrally. In some embodiments, the second conductive element 46 includes a part (top portion) of the seed layer 54 disposed adjacent to the first surface 31 of the dielectric layer 3. Accordingly, the upper surface 461 of the second conductive element 46 is a top surface of the seed layer 54. However, in other embodiments, the part (top portion) of the seed layer 54 disposed adjacent to the first surface 31 of the dielectric layer 3 may be omitted (e.g., removed completely), and the upper surface 461 of the second conductive element 46 is a top surface of the conductive metal 53a.

The first protective layer 28 is disposed on the first surface 31 of the dielectric layer 3 and covers at least a portion of the first circuit layer 4. The second protective layer 29 is disposed on the second surface 32 of the dielectric layer 3 and covers at least a portion of the second circuit layer 5. The first protective layer 28 and the second protective layer 29 may be made of a solder resist material, for example, benzocyclobutene (BCB) or polyimide (PI). The materials of the first protective layer 28 and the second protective layer 29 may be the same or different from each other.

In some embodiments of the present disclosure, since the second conductive element 46 can serve as a bump pad directly connected to an electronic component, a device, a connection component (e.g., pillar or solder bump), or other elements, a pitch between bump pads may be reduced, a number of bump pads (and corresponding input/output (I/O) capability) may be increased, and/or dimensions (e.g., length, width, height, or surface area) of a semiconductor package may be reduced. Besides, the second conductive element 46 with no via land may allow for very thin packaging, as well as more dense routing.

In some embodiments of the present disclosure, since the areas of the first conductive element 44 and the second conductive element 46 are substantially the same, when a die 14 (e.g., FIG. 5) is connected to both the first conductive element 44 and the second conductive element 46 through solders, the wetting behavior of the solder on the first conductive element 44 may be substantially the same as that on the second conductive element 46. Hence, the solders with substantially the same volume form connecting elements 144 (e.g., FIG. 5) with substantially the same height on both the first conductive element 44 and the second conductive element 46, thus making the die 14 (e.g., FIG. 5) substantially parallel to the substrate 1.

In addition, the upper surface 461 of the second conductive element 46 can be used as a bump pad, and thus electrical signals can be transmitted from the upper surface 461 of the second conductive element 46 to the second circuit layer 5 directly and vertically. Therefore, the routed trace 42 of the first circuit layer 4 is reduced, and a large space is made available so as to loosen a line width/line space (L/S) of the first circuit layer 4, increase I/O counts of the first circuit layer 4 and reduce a size of a semiconductor package 2 (e.g., FIG. 5). Further, the design of the bump pad of the first circuit layer 4 is flexible, and the short path through which the electrical signals are transmitted can result in better electrical performance.

Figure 3A:
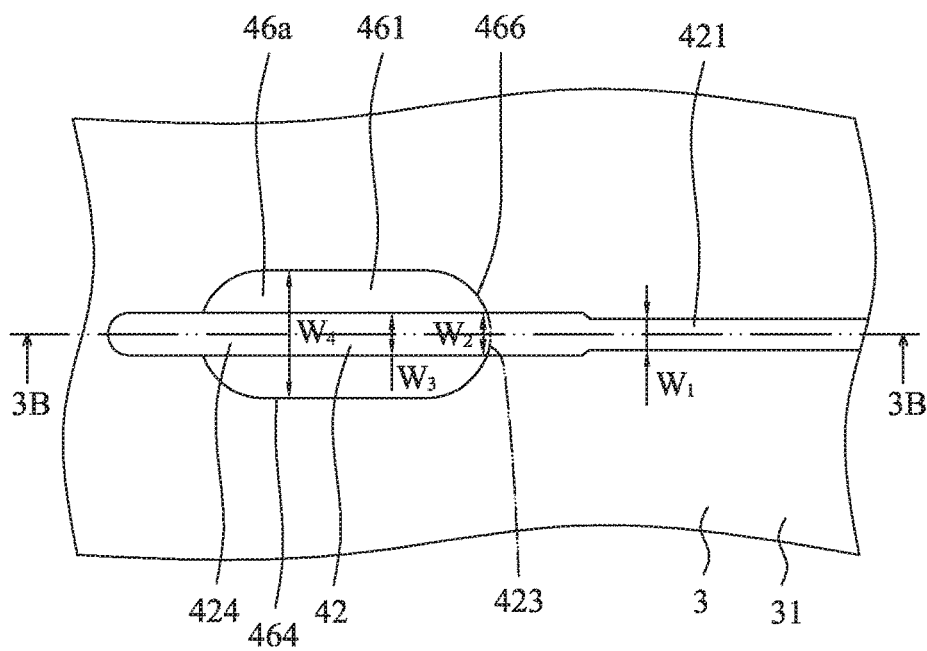
FIG. 3A illustrates a top view of an example of a second conductive element of the substrate shown in FIGS. 1 and 2 according to some embodiments of the present disclosure.
Figure 3B:
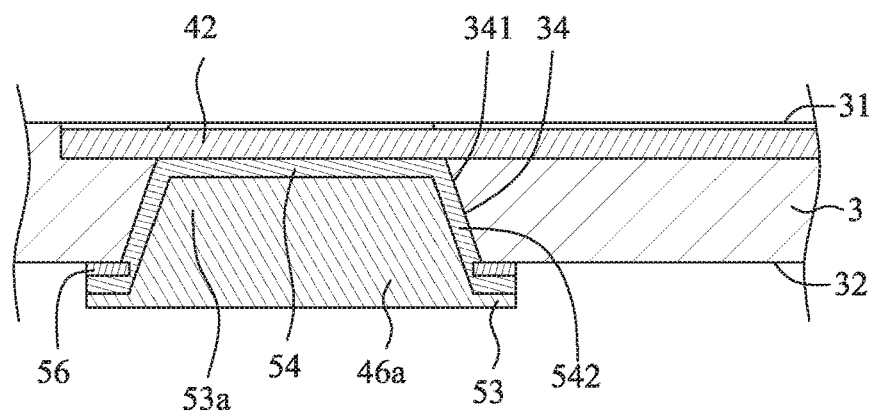
FIG. 3B illustrates a cross-sectional view along line 3B-3B in FIG. 3A according to some embodiments of the present disclosure.

FIG. 3A illustrates a top view of an example of the second conductive element 46a of the substrate 1 shown in FIGS. 1 and 2 according to some embodiments of the present disclosure. FIG. 3B illustrates a cross-sectional view along line 3B-3B in FIG. 3A according to some embodiments of the present disclosure. In some embodiments, as shown in FIG. 3A, the second conductive element 46a includes a longer side 464 and a shorter side 466. The trace 42 is connected to the shorter side 466 of the second conductive element 46a. The trace 42 includes a first section 421 and a first imaginary interface 423. The first section 421 is further away from the second conductive element 46a. The first imaginary interface 423 is an imaginary segment of a periphery of the second conductive element 46a and crosses the trace 42. The first section 421 of the trace 42 has a width $W_1$. The first imaginary interface 423 of the trace 42 has a width $W_2$. The width $W_2$ of the first imaginary interface 423 is greater than the width $W_1$ of the first section 421 of the trace 42. Thus, stress between the trace 42 and the second conductive element 46a is reduced.

The trace 42 may further include a second section 424 within or overlapping with the second conductive element 46a. The second section 424 of the trace 42 has a width $W_3$. The upper surface 461 of the second conductive element 46a has a width $W_4$. The width $W_3$ of the second section 424 of the trace 42 is less than the width $W_4$ of the upper surface 461 of the second conductive element 46a. For example, as shown in FIG. 3A, the second conductive element 46a may include a pair of longer sides 464, and the width $W_4$ is a distance of the upper surface 461 between the pair of longer sides 464.

Referring to FIGS. 3A and 3B, the trace 42 may extend through and beyond the second conductive element 46a. For example, the second conductive element 46a may include a pair of shorter sides 466, and the trace 42 may extend through both of the shorter sides 466, thus forming two first imaginary interfaces 423 with the second conductive element 46a.

Figure 3C:
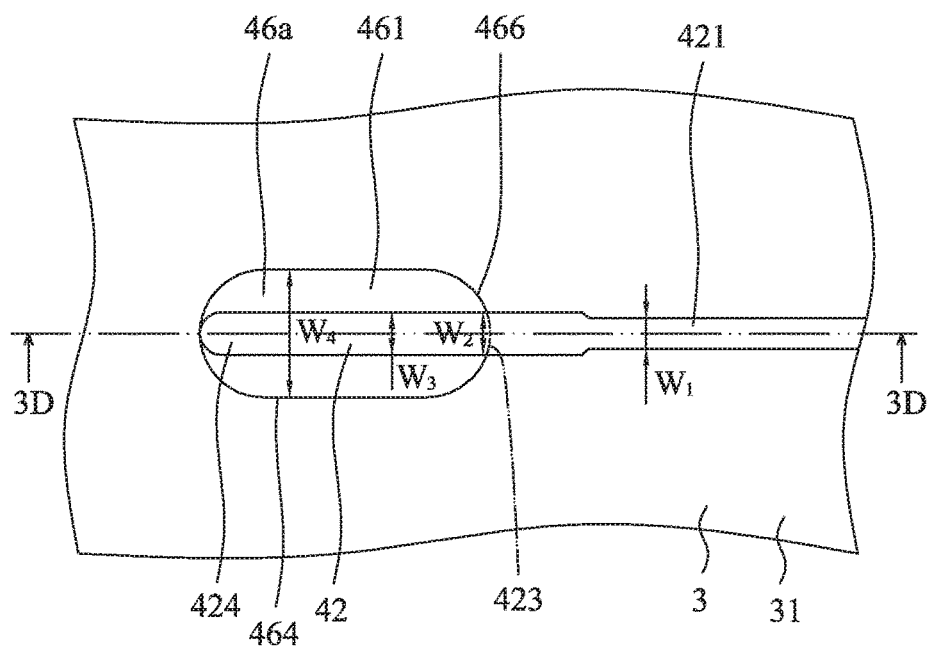
FIG. 3C illustrates a top view of an example of a second conductive element of the substrate shown in FIGS. 1 and 2 according to some embodiments of the present disclosure.
Figure 3D:
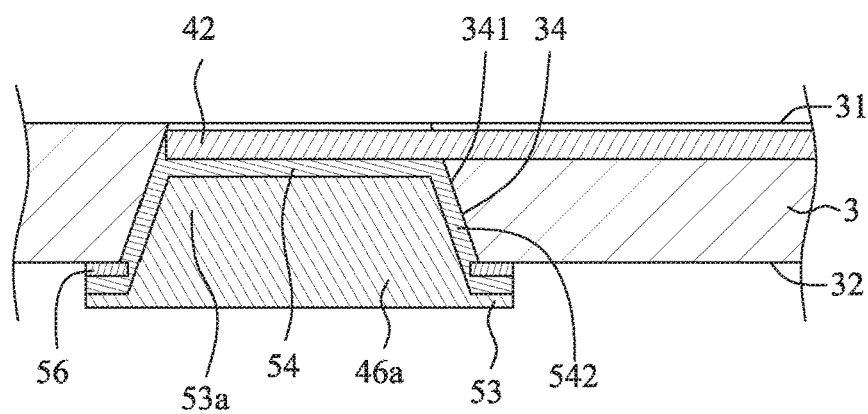
FIG. 3D illustrates a cross-sectional view along line 3D-3D in FIG. 3C according to some embodiments of the present disclosure.

FIG. 3C illustrates a top view of an example of the second conductive element 46a of the substrate 1 shown in FIGS. 1 and 2 according to some embodiments of the present disclosure. FIG. 3D illustrates a cross-sectional view along line 3D-3D in FIG. 3C according to some embodiments of the present disclosure. Alternatively, the trace 42 may not extend beyond the second conductive element 46a. For example, as shown in FIGS. 3C and 3D, the trace 42 extends through one of the shorter sides 466 and just reaches the other shorter side 466.

Figure 3E:
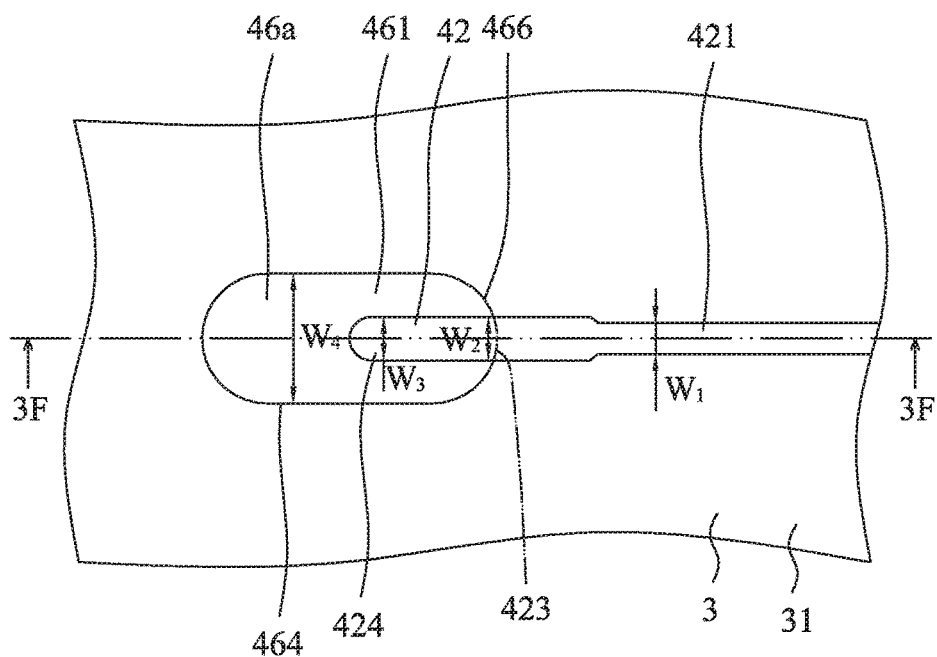
FIG. 3E illustrates a top view of an example of a second conductive element of the substrate shown in FIGS. 1 and 2 according to some embodiments of the present disclosure.
Figure 3F:
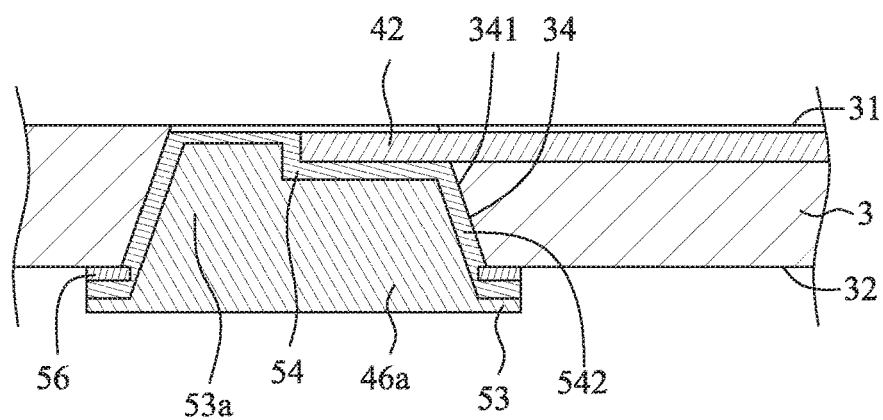
FIG. 3F illustrates a cross-sectional view along line 3F-3F in FIG. 3E according to some embodiments of the present disclosure.

FIG. 3E illustrates a top view of an example of the second conductive element 46a of the substrate 1 shown in FIGS. 1 and 2 according to some embodiments of the present disclosure. FIG. 3F illustrates a cross-sectional view along line 3F-3F in FIG. 3E. As shown in FIGS. 3E and 3F, an end of the trace 42 may be located within the upper surface 461. In other words, the trace 42 extends through one of the shorter sides 466 but does not reach the other shorter side 466.

As can be seen by FIGS. 3A to 3F, techniques for the second conductive elements 46a according to some embodiments of the present disclosure provide a wide variety of design options for layout and routing of the substrate 1.

Figure 3G:
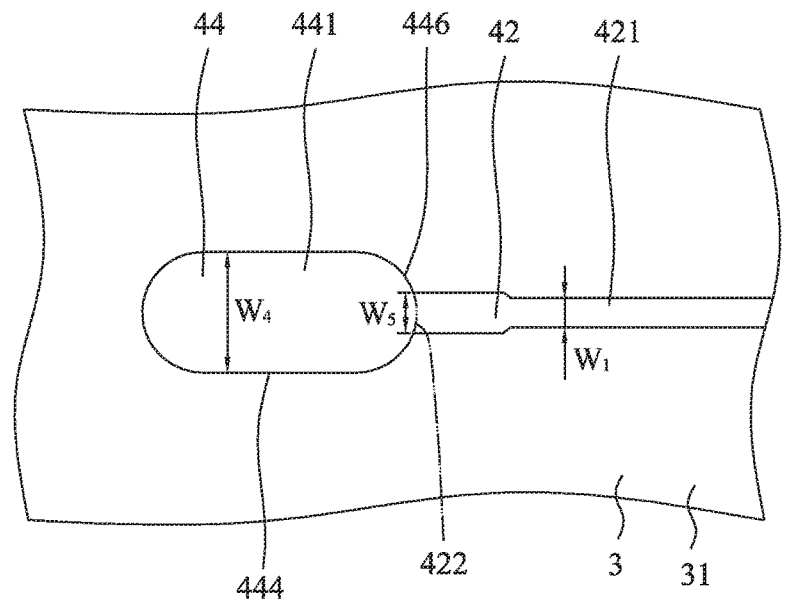
FIG. 3G illustrates a top view of an example of a first conductive element of the substrate shown in FIGS. 1 and 2 according to some embodiments of the present disclosure.

FIG. 3G illustrates a top view of an example of the first conductive element 44 connected to the trace 42 of the substrate 1 according to some embodiments of the present disclosure. As shown in FIG. 3G, the first conductive element 44 may also include a longer side 444 and a shorter side 446, and the trace 42 is connected to the shorter side 446 of the first conductive element 44. The trace 42 includes the first section 421 and a second imaginary interface 422. The first section 421 is further away from the first conductive element 44 (and also further away from the second conductive element 46, as described above). The second imaginary interface 422 is an imaginary segment of a periphery of the first conductive element 44 and crosses the trace 42. The first section 421 of the trace 42 has the width $W_1$, as described above. The second imaginary interface 422 of the trace 42 has a width $W_5$. The width $W_5$ of the second imaginary interface 422 is greater than the width $W_1$ of the first section 421 of the trace 42.

The cross-sectional design shape of the second conductive element 46 may vary in dimension or shape from the lower (or second) surface 462 to the first (or upper) surface 461 of the second conductive element 46. An example of a different cross-sectional design shape of a second conductive element 46 is discussed below.

Figure 4:
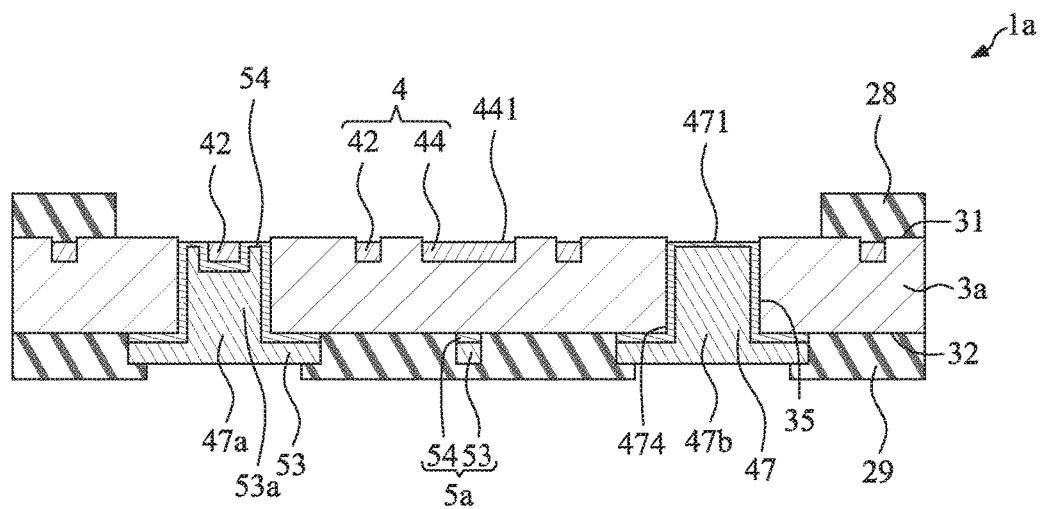
FIG. 4 illustrates a cross-sectional view of an example of a substrate according to some embodiments of the present disclosure.

FIG. 4 illustrates a substrate 1a according to some embodiments of the present disclosure. The substrate 1a is similar to the substrate 1 shown in FIGS. 1 and 2, and includes a first dielectric layer 3a, a first circuit layer 4, at least one second conductive element 47, a second circuit layer 5a, a first protective layer 28 and a second protective layer 29.

The dielectric layer 3a is similar to the dielectric layer 3 of the substrate 1 shown in FIGS. 1 and 2. However, the material may be made of a photo-imageable dielectric (PID) material, such as epoxy or PI including photoinitiators. The dielectric layer 3a defines at least one through hole 35. Cross sections of the through hole 35 parallel to a first surface 31 of the dielectric layer 3a may have substantially the same size and shape. For example, the through hole 35 has a substantially consistent width/diameter throughout. The second conductive elements 47 (including 47a and 47b) are also similar to the second conductive elements 46 (including 46a and 46b) of the substrate 1 shown in FIGS. 1 and 2, but the second conductive element 47 may be in a pillar-like structure. For example, cross sections of the second conductive element 47 parallel to an upper surface 471 of the second conductive element 47 may have substantially the same size and shape. For example, the second conductive element 47 includes a lower portion 474 adjacent to the second surface 32 of the dielectric layer 3a, and connected to the second circuit layer 5a. A cross section of the lower portion 474 has a size and a shape substantially the same as a size and a shape of the upper surface 471. The second circuit layer 5a is similar to the second circuit layer 5 of the substrate 1 shown in FIGS. 1 and 2, but the mask layer 56 of the substrate 1 is omitted in the substrate 1a. The first circuit layer 4, the first protective layer 28 and the second protective layer 29 are similar to those of the substrate 1 shown in FIGS. 1 and 2. As can be seen by the substrate 1 in FIGS. 1 and 2 and the substrate 1a in FIG. 4, the cross-sectional design shape of the second conductive element 47 may vary in dimension or shape from the upper surface (or second surface) 471 to a lower surface (or first surface) opposite to the upper surface 471 of the second conductive element 47.

Figure 5:
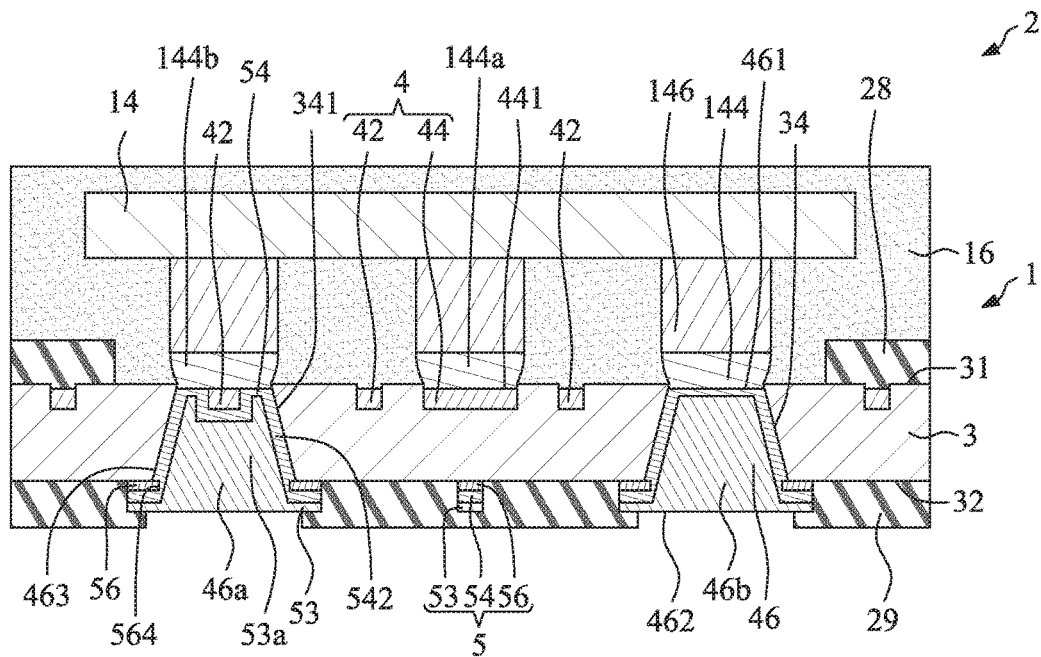
FIG. 5 illustrates a cross-sectional view of an example of a semiconductor package according to some embodiments of the present disclosure.

FIG. 5 illustrates a semiconductor package 2 according to some embodiments of the present disclosure. The semiconductor package 2 includes the substrate 1, a die 14, and an encapsulant 16.

The substrate 1 of the semiconductor package 2 in FIG. 5 is similar to the substrate 1 shown in FIGS. 1 and 2. The die 14 includes a plurality of connecting elements 144. At least one of the connecting elements 144 is electrically connected to the first conductive element 44, and at least another one of the connecting elements 144 is electrically connected to the second conductive element 46. As shown in FIG. 5, the die 14 is connected to the substrate 1 in a flip-chip manner, and the connecting elements 144 are solders. For example, the die 14 includes pillars 146 which are connected to the connecting elements 144. The connecting elements 144 include a connecting element (or first connecting element) 144a connected to the first conductive element 44, and another connecting element (or second connecting element) 144b connected to the second conductive element 46. The encapsulant 16 (e.g., a molding compound) covers the die 14, the pillars 146, the connecting elements 144 and the substrate 1. In some embodiments, the encapsulant 16 completely covers the die 14. However, in other embodiments, an upper surface of the die 14 may be exposed from the encapsulant 16.

Since the area of the upper surface 441 of the first conductive element 44 is substantially the same as the area of the upper surface 461 of the second conductive element 46, a substantially same amount of solder applied on the upper surface 441 of the first conductive element 44 and the upper surface 461 of the second conductive element 46 results in a substantially same height of the connecting elements 144 formed by the solder. Accordingly, the die 14 can be connected to and substantially parallel to the substrate 1.

Figure 6:
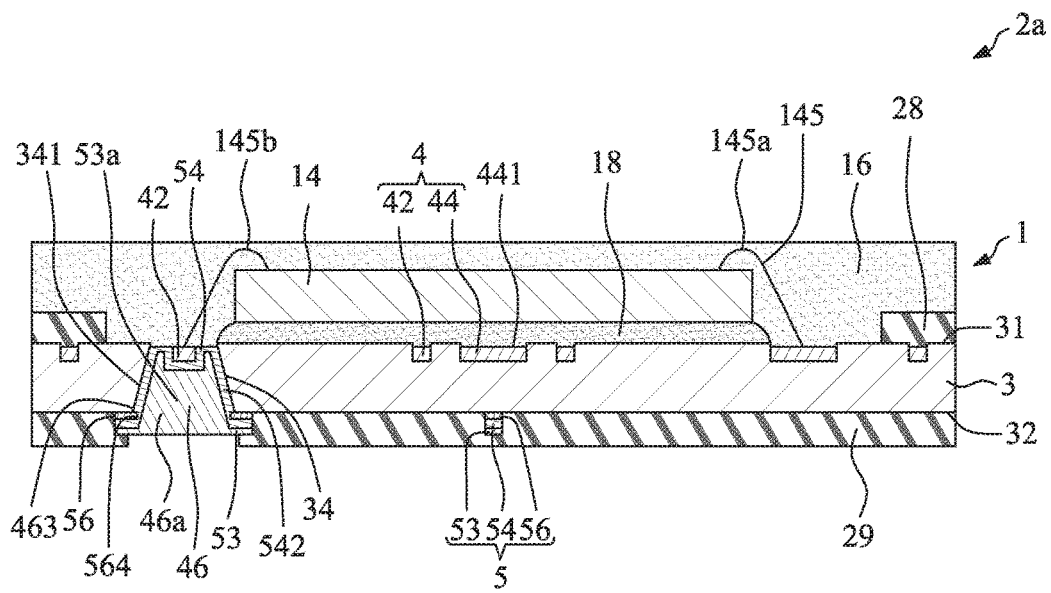
FIG. 6 illustrates a cross-sectional view of an example of a semiconductor package according to some embodiments of the present disclosure.

FIG. 6 illustrates a semiconductor package 2a according to some embodiments of the present disclosure. The semiconductor package 2a is similar to the semiconductor package 2 shown in FIG. 5, except that the die 14 is connected to the substrate 1 through wire-bonding. As shown in FIG. 6, the semiconductor package 2a includes a plurality of connecting elements 145, and the connecting elements 145 are bonding wires. Similarly, at least one of the connecting elements 145 is electrically connected to the first conductive element 44, and at least another one of the connecting elements 145 is electrically connected to the second conductive element 46. For example, the connecting elements 145 includes a first connecting element 145a connected to the first conductive element 44, and a second connecting element 145b connected to the second conductive element 46. In some embodiments, an adhesive 18 may be applied, making the die 14 adhere to the first surface 31 of the dielectric layer 3.

Figure 7:
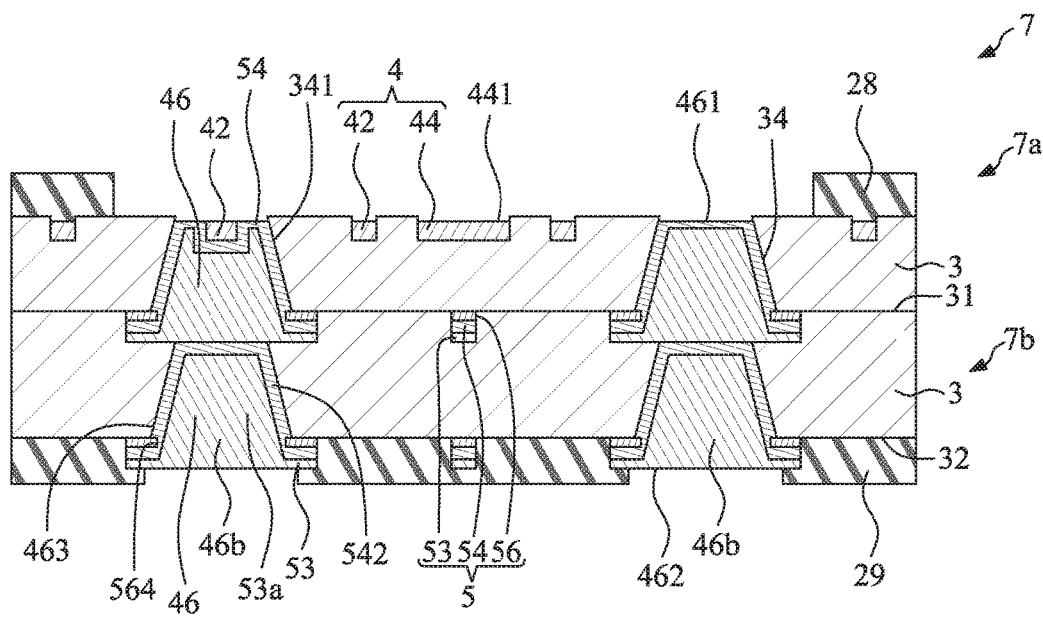
FIG. 7 illustrates a cross-sectional view of an example of a substrate according to some embodiments of the present disclosure.

FIG. 7 illustrates a substrate 7 according to some embodiments of the present disclosure. The substrate 7 includes an upper portion 7a and a lower portion 7b. The upper portion 7a of the substrate 7 of FIG. 7 may be the same as the substrate 1 as shown in FIGS. 1 and 2, except that the second protective layer 29 is omitted. The lower portion 7b of the substrate 7 of FIG. 7 may be the same as the substrate 1 as shown in FIGS. 1 and 2, except that the first protective layer 28 and the first circuit layer 4 are omitted. The dielectric layer 3 of the lower portion 7b contacts the dielectric layer 3 of the upper portion 7a and covers the second circuit layer 5 of the upper portion 7a. The second conductive element 46 of the upper portion 7a can be electrically connected to the second circuit layer 5 of the upper portion 7a or the second conductive element 46 of the lower portion 7b. In some embodiments, the first circuit layer 4 of the upper portion 7a may be omitted.

Figure 8:
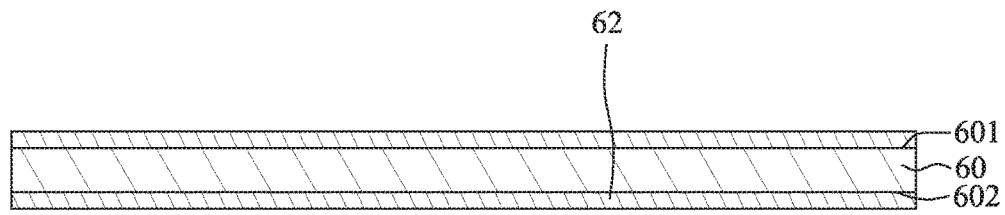
FIG. 8 illustrates one or more stages of an example of a method for manufacturing a substrate according to some embodiments of the present disclosure.

FIG. 8 to FIG. 19 illustrate a method for manufacturing a substrate according to some embodiments of the present disclosure. In some embodiments, the method is for manufacturing a substrate such as the substrate 1 shown in FIGS. 1 and 2. Referring to FIG. 8, a carrier 60 is provided. Then, a first metal layer 62 is formed or disposed on a lower surface 602 of the carrier 60. The first metal layer 62 may be a copper foil and is pressed on or adhered to the carrier 60. In some embodiments, as shown in FIG. 8, the substrate can be manufactured on both an upper surface 601 and the lower surface 602 of the carrier 60. For example, the first metal layer 62 can be formed or disposed on both the upper surface 601 and the lower surface 602 of the carrier 60.

Figure 9:
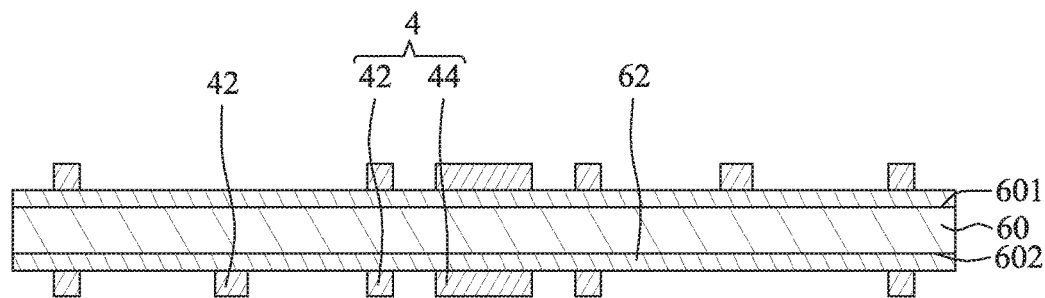
FIG. 9 illustrates one or more stages of an example of a method for manufacturing a substrate according to some embodiments of the present disclosure.

Referring to FIG. 9, a first circuit layer 4 is formed or disposed on the first metal layer 62. The first circuit layer 4 is made of a conductive material, such as copper, and may be formed or disposed by electroplating. The first circuit layer 4 includes at least one trace 42 and at least one first conductive element 44. The first conductive element 44 is connected to the trace 42. As shown in FIG. 9, the trace 42 and the first conductive element 44 can be formed or disposed concurrently and have substantially the same thickness. For example, the first conductive element 44 may be a bump pad.

Figure 10:
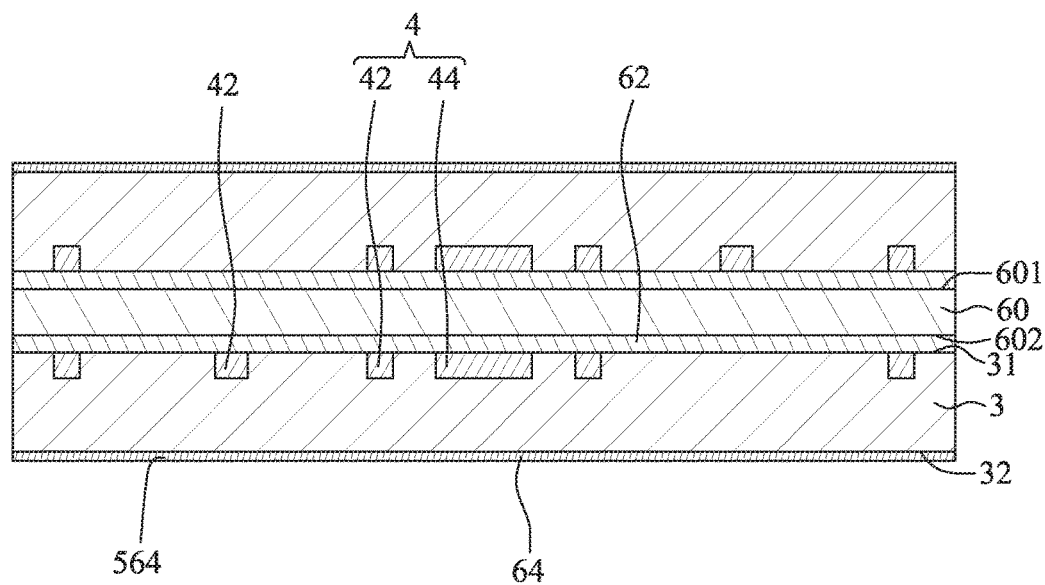
FIG. 10 illustrates one or more stages of an example of a method for manufacturing a substrate according to some embodiments of the present disclosure.

Referring to FIG. 10, a dielectric layer 3 is formed or disposed on and covers the first metal layer 62 and the first circuit layer 4. The dielectric layer 3 is made of an insulating material, such as PP. The dielectric layer 3 has a first surface 31 and a second surface 32. The first surface 31 of the dielectric layer 3 is disposed on the first metal layer 62. As shown in FIG. 10, the first circuit layer 4 is disposed adjacent to the first surface 31 of the dielectric layer 3. For example, the first circuit layer 4 is embedded in the dielectric layer 3 and exposed from the first surface 31 of the dielectric layer 3. Then, a second metal layer 64 is formed or disposed on the second surface 32 of the dielectric layer 3. The second metal layer 64 may be a metal film such as a copper foil, and is pressed on or adhered to the second surface 32 of the dielectric layer 3.

Figure 11:
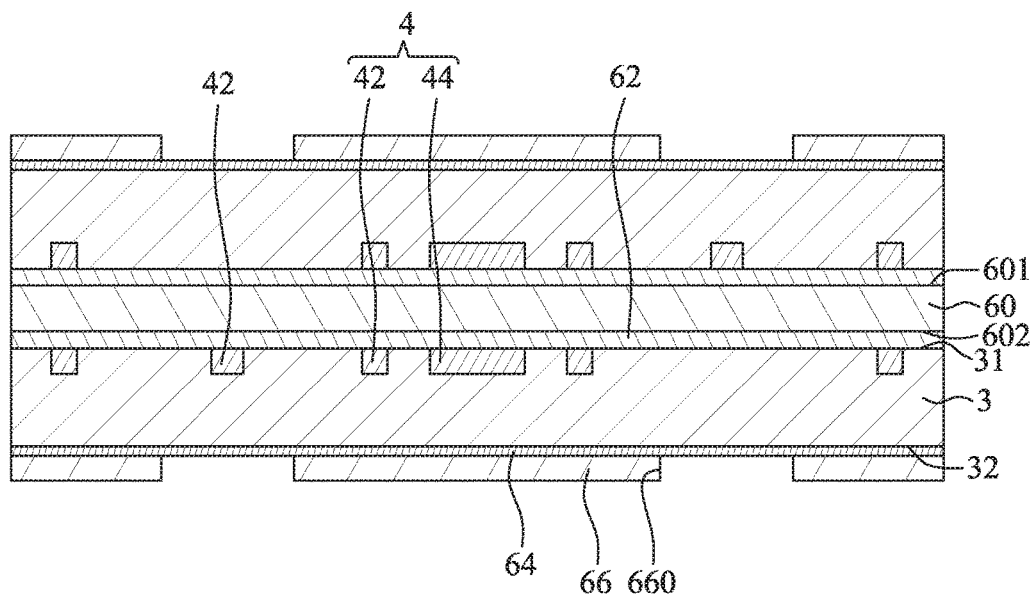
FIG. 11 illustrates one or more stages of an example of a method for manufacturing a substrate according to some embodiments of the present disclosure.

Referring to FIG. 11, a photoresist layer 66 is formed or disposed on the second metal layer 64. The photoresist layer 66 may be applied in a dry-film form. The photoresist layer 66 defines a plurality of openings 660 extending through the photoresist layer 66, and portions of the second metal layer 64 are exposed from the openings 660 of the photoresist layer 66. The photoresist layer 66 may be made of a photo-imageable material, and the openings 660 may be patterned by a lithography technique.

Figure 12:
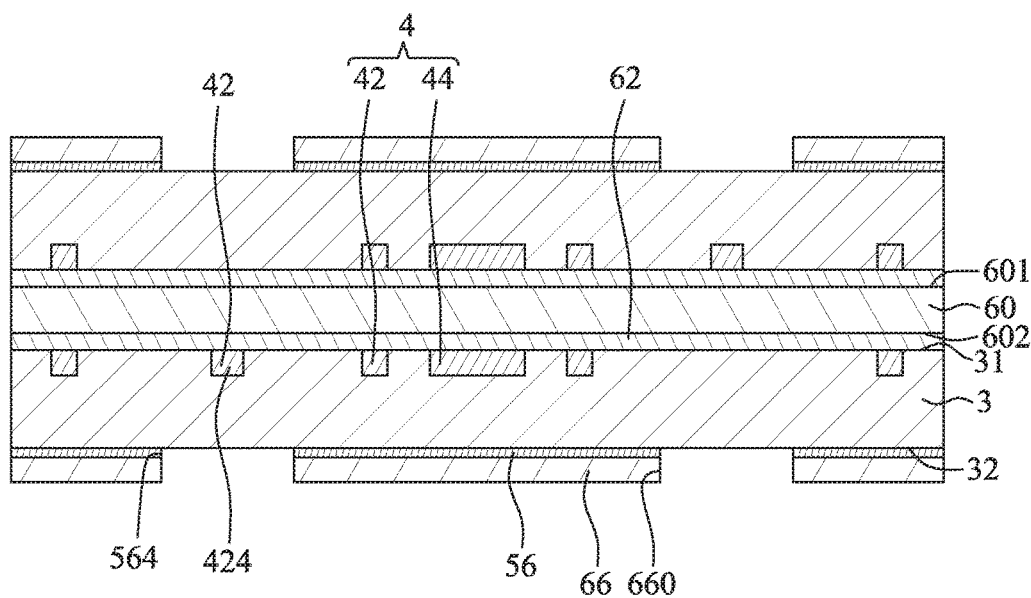
FIG. 12 illustrates one or more stages of an example of a method for manufacturing a substrate according to some embodiments of the present disclosure.

Referring to FIG. 12, the exposed portions of the second metal layer 64 are removed by, for example, etching. Accordingly, the second metal layer 64 forms a mask layer 56 defining a plurality of openings 564. For example, the mask layer 56 is formed of a metal film (e.g., the same metal film as the second metal layer 64), and the plurality of openings 564 of the mask layer 56 is formed by a lithography technique. The opening 564 of the mask layer 56 corresponds to the opening 660 of the photoresist layer 66. At least one of the openings 564 may overlap a portion of the trace 42 (e.g., a second section 424 as shown in FIG. 3A).

Figure 13:
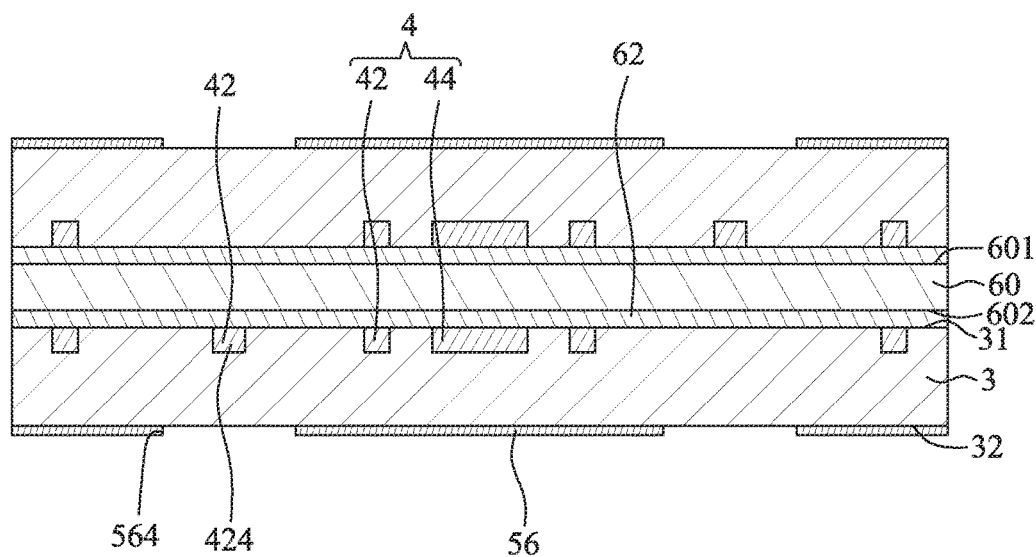
FIG. 13 illustrates one or more stages of an example of a method for manufacturing a substrate according to some embodiments of the present disclosure.

Referring to FIG. 13, the photoresist layer 66 is removed by, for example, stripping.

Figure 14:
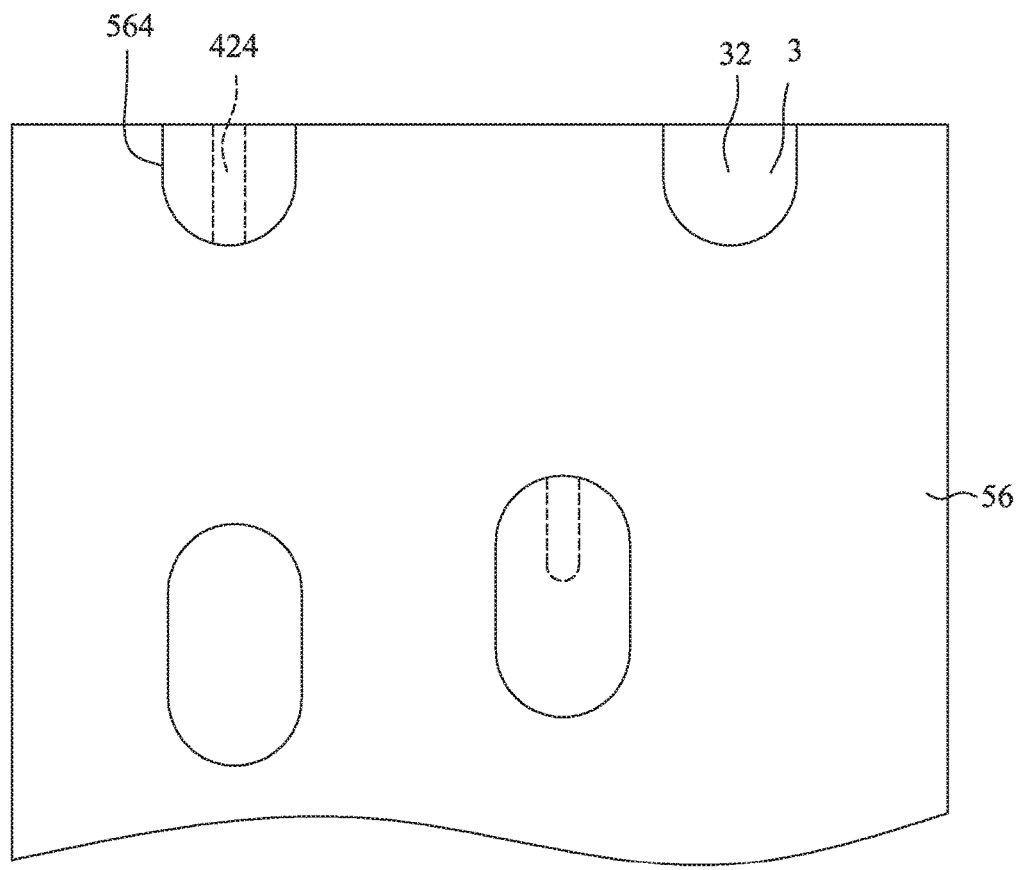
FIG. 14 illustrates one or more stages of an example of a method for manufacturing a substrate according to some embodiments of the present disclosure.

FIG. 14 illustrates a bottom view of the mask layer 56 and the dielectric layer 3 on the lower surface 602 of the carrier 60. Portions of the dielectric layer 3 are exposed from the openings 564 of the mask layer 56.

Figure 15:
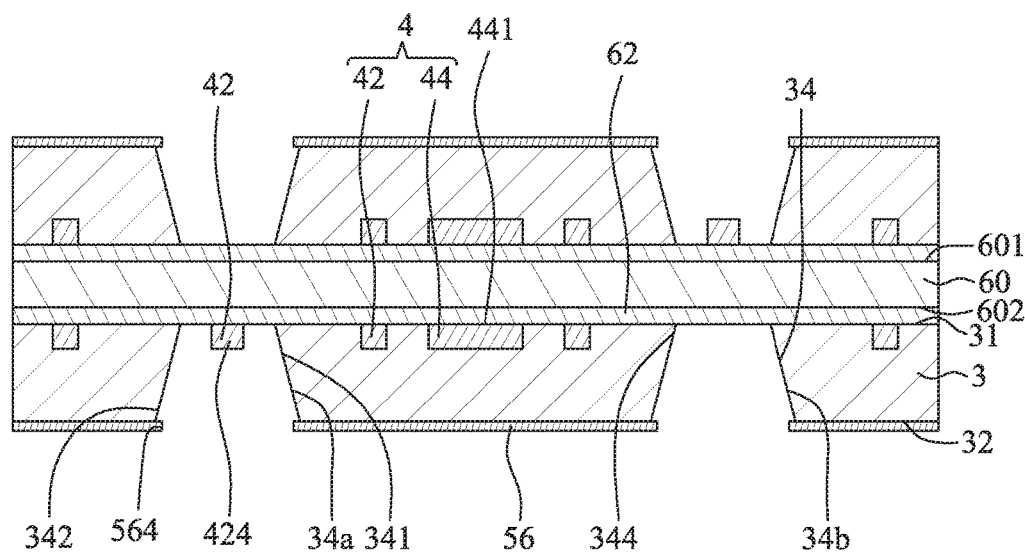
FIG. 15 illustrates one or more stages of an example of a method for manufacturing a substrate according to some embodiments of the present disclosure.

Referring to FIG. 15, a plurality of through holes 34 of the dielectric layer 3 are formed corresponding to the openings 564 of the mask layer 56, for example, by laser drilling. The through hole 34 extends through the dielectric layer 3 and has a sidewall 341. For example, a laser beam is applied to each of the openings 564 of the mask layer 56. An area of the laser beam may cover and be slightly larger than an area of each opening 564. Since the energy of the laser beam may be blocked and absorbed by the mask layer 56, the portions of the dielectric layer 3 exposed from the openings 564 of the mask layer 56 can be selectively removed by the laser beam, and thus forming the through holes 34 corresponding to the openings 564. Due to energy distribution of the laser beam, the through holes 34 may taper toward the first surfaces 31 of the dielectric layer 3. In some embodiments, a laser undercut may occur at a portion 342 of each through hole 34 adjacent to the mask layer 56, thus making a size of the opening 564 smaller than a size of the portion 342 of the through hole 34.

Figure 16A:
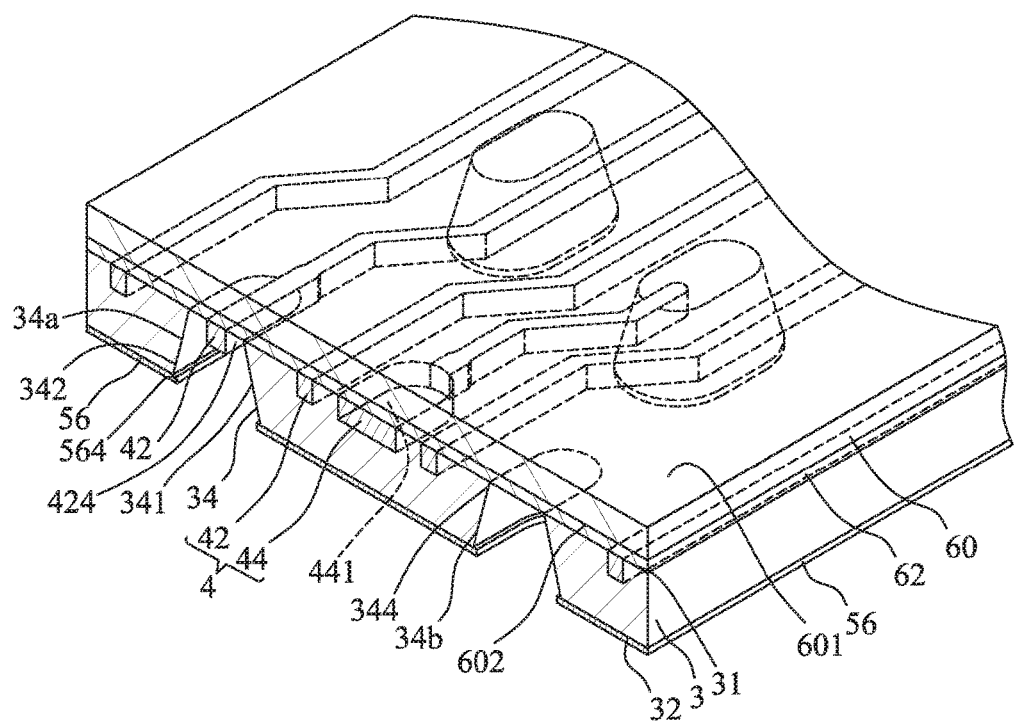
FIG. 16A illustrates one or more stages of an example of a method for manufacturing a substrate according to some embodiments of the present disclosure.
Figure 16B:
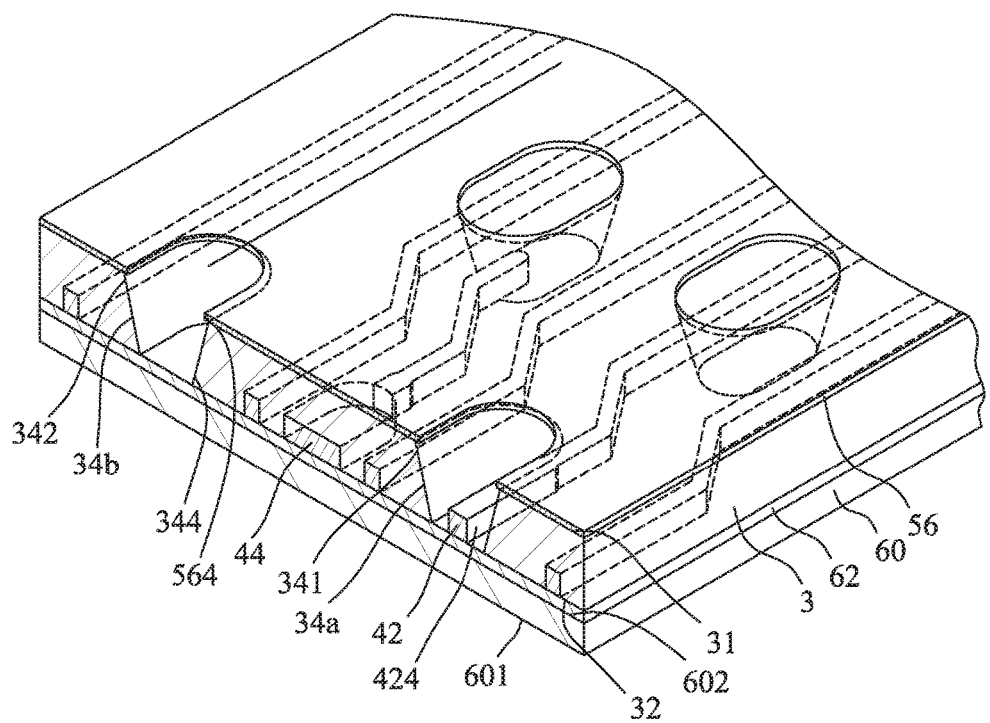
FIG. 16B illustrates one or more stages of an example of a method for manufacturing a substrate according to some embodiments of the present disclosure.

FIGS. 16A and 16B illustrate perspective views of the mask layer 56, the dielectric layer 3 with the through holes 34, the first circuit layer 4 and the first metal layer 62 on the lower surface 602 of the carrier 60 from bottom and top sides, respectively. For illustration purposes, the mask layer 56, the dielectric layer 3 with the through holes 34, the first circuit layer 4 and the first metal layer 62 on the upper surface 601 of the carrier 60 are not shown in FIGS. 16A and 16B. As mentioned above, at least one of the openings 564 overlaps with the second section 424 of the trace 42. Accordingly, after forming the through holes 34 of the dielectric layer 3 corresponding to the openings 564, one of the through holes 34 (e.g., the through hole 34a) overlaps the trace 42 of the first circuit layer. For example, the through holes 34a may overlap the second section 424 of the trace 42, and the second section 424 of the trace 42 may be exposed in the through hole 34a. On the other hand, another one of the through holes 34 (e.g., the through hole 34b) may not overlap the trace 42 of the first circuit layer. In some embodiments, the through hole 34b that does not overlap the trace 42 of the first circuit layer 4 has an upper portion 344 adjacent to the first surface 31 of the dielectric layer 3, and an area of a cross section of the upper portion 344 is substantially equal to an area of an upper surface 441 of the first conductive element 44 of the first circuit layer 4.

Figure 17:
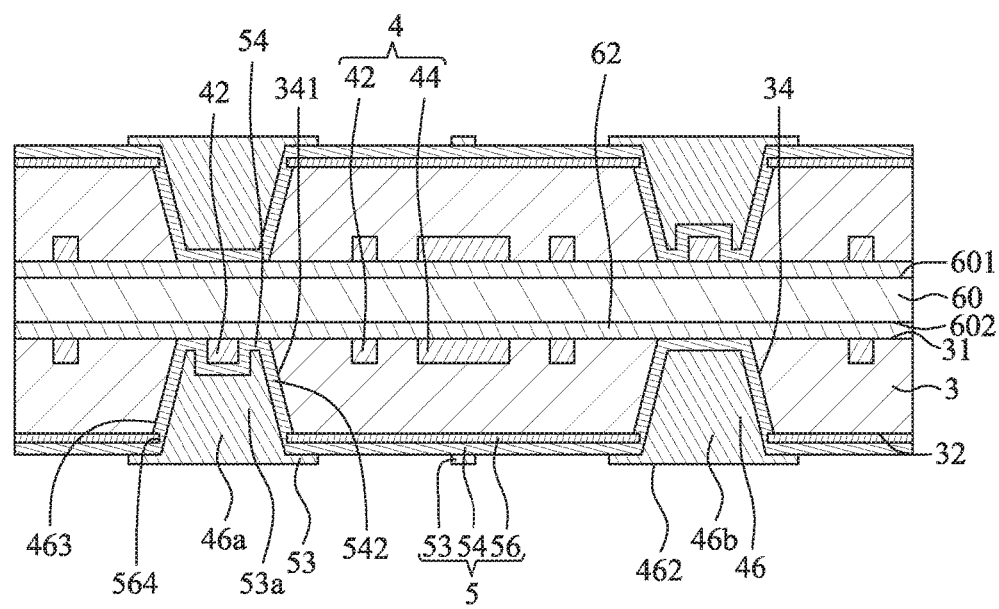
FIG. 17 illustrates one or more stages of an example of a method for manufacturing a substrate according to some embodiments of the present disclosure.

Referring to FIG. 17, the through holes 34 are filled with a conductive material such as a seed layer 54 and a conductive metal 53a, so as to form at least one second conductive element 46. In some embodiments, a second circuit layer 5 is concurrently formed or disposed on the second surface 32 of the dielectric layer 3. For example, the seed layer 54 is formed or disposed in the through holes 34 of the dielectric layer 3 and on the mask layer 56. For example, the seed layer 54 conformably coats the sidewall 341 of the through hole 34. The seed layer 54 is formed or disposed before filling the through holes 34 with the conductive metal 53a and forming the second circuit layer 5 on the second surface 32 of the dielectric layer 3. The seed layer 54 may include, for example, titanium and/or copper, and may be formed or disposed by sputtering. In the case that the second section 424 is exposed in the through hole 34, the seed layer 54 covers the second section 424 of the trace 42. Then, the conductive metal 53a, such as copper, is filled in the through holes 34 of the dielectric layer 3 to form the second conductive elements 46 and concurrently form a patterned metal layer 53 on the seed layer 54. For example, the conductive metal 53a and the patterned metal layer 53 are formed or disposed integrally. The seed layer 54 includes a portion 542 interposed between the conductive metal 53a and the dielectric layer 3 in the through hole 34. The patterned metal layer 53 covers portions of the seed layer 54, while other portions of the seed layer 54 remain exposed.

Figure 18:
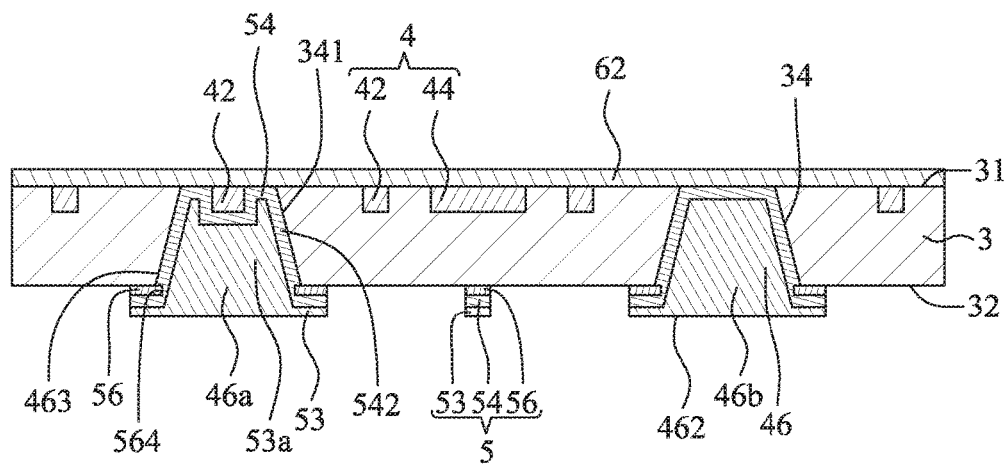
FIG. 18 illustrates one or more stages of an example of a method for manufacturing a substrate according to some embodiments of the present disclosure.

Referring to FIG. 18, the exposed portions of the seed layer 54 and the mask layer 56 thereunder are removed by, for example, etching. The second circuit layer 5 is thus formed and includes the mask layer 56, the seed layer 54 and the patterned metal layer 53.

Accordingly, the at least one second conductive element 46 includes a second conductive element 46a (e.g., formed or disposed in the through hole 34a overlapping the trace 42) that is connected to the trace 42 of the first circuit layer 4. In some embodiments, the at least one second conductive element 46 includes a second conductive element 46b (e.g., formed or disposed in the through hole 34b that does not overlap the trace 42) that is not connected to the trace 42 of the first circuit layer 4. Accordingly, the at least one trace 42 of the first circuit layer 4 may include a trace 42 having an end connected to the first conductive element 44 and another end connected to the second conductive element 46.

Then, the carrier 60 is removed from the first metal layer 62, thereby providing two substrates, one of which is shown in FIG. 18.

Figure 19:
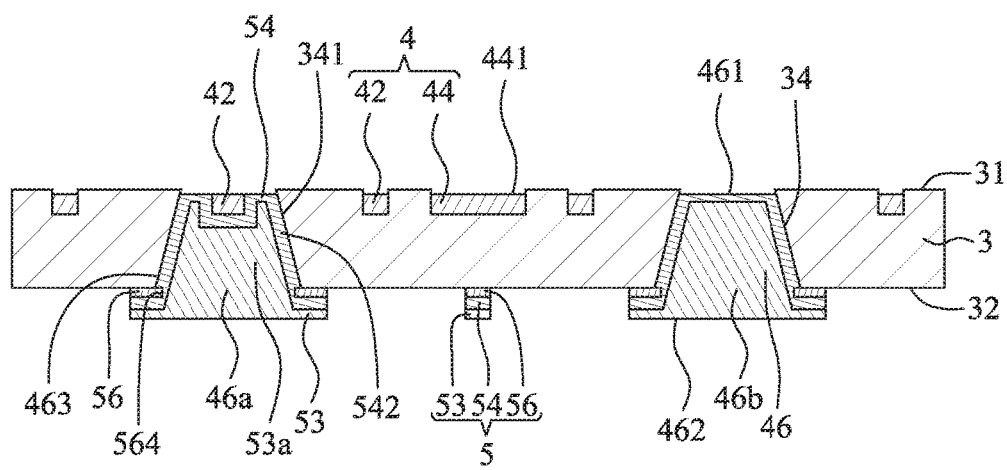
FIG. 19 illustrates one or more stages of an example of a method for manufacturing a substrate according to some embodiments of the present disclosure.

Referring to FIG. 19, the first metal layer 62 is removed (e.g., by etching or grinding) until the first surface 31 of the dielectric layer 3 is exposed, forming the upper surface 441 of the first conductive element 44 and the upper surface 461 of the second conductive element 46 adjacent to the first surface 31 of the dielectric layer 3. In the case that the first metal layer 62 is removed by etching, the first circuit layer 4 and the second conductive element 46 may be slightly recessed from the first surface 31 of the dielectric layer 3. For example, the upper surface 441 of the first conductive element 44 and the upper surface 461 of the second conductive element 46 may be slightly lower than the first surface 31 of the dielectric layer 3. In some embodiments, a thickness of a part (e.g., top portion) of the seed layer 54 disposed adjacent to the first surface 31 of the dielectric layer 3 is reduced during the etching process. In some other embodiments, the part (e.g., top portion) of the seed layer 54 disposed adjacent to the first surface 31 may be completely etched away. After the etching process, a distance between the first surface 31 of the dielectric layer 3 and the upper surface 461 of the second conductive element 46 (as well as the upper surface 441 of the first conductive element 44) may be less than about 5 micrometers (μm), so that the connecting elements 144 of a die 14 (e.g., as shown in FIG. 5) can be properly connected to the second conductive element 46 (and the first conductive element 44). In some embodiments, if such a distance is too large (e.g., greater than about 5 μm) and the substrate 1 (e.g., shown in FIGS. 1 and 2) deforms into a convex shape or a concave shape, the connecting elements 144 of a die 14 (e.g., shown in FIG. 5) may not be properly connected to the second conductive element 46 (and the first conductive element 44) because a part of the connecting elements 144 (e.g., solders) may contact the first circuit layer 4 and another part of the connecting elements 144 (e.g., solders) may not contact the first circuit layer 4.

As shown in FIG. 19, the second conductive element 46 is a monolithic structure, and the upper surface 461 of the second conductive element 46 is exposed from the first surface 31 of the dielectric layer 3.

Since the area of a cross section of the upper portion 344 of the through hole 34 is substantially equal to the area of the upper surface 441 of the first conductive element 44 of the first circuit layer 4, an area of the upper surface 461 of the second conductive element 46 is substantially equal to the area of the upper surface 441 of the first conductive element 44. In some embodiments, a shape and a size of the upper surface 461 of the second conductive element 46 is substantially equal to a shape and a size of the upper surface 441 of the first conductive element 44. In other words, the upper surface 461 of the second conductive element 46 is substantially congruent to the upper surface 441 of the first conductive element 44.

Since the through holes 34 taper toward the first surface 31 of the dielectric layer 3, the second conductive element 46 includes a maximum portion 463 adjacent to the second surface 32 of the dielectric layer 3. The maximum portion 463 of the second conductive element 46 is connected to the second circuit layer 5. A shape of a cross section of the maximum portion 463 of the second conductive element 46 is similar to the shape of the upper surface 461 of the second conductive element 46, but the size of the cross section of the maximum portion 463 of the second conductive element 46 is greater than the size of the upper surface 441 of the first conductive element 44. Accordingly, the size of the upper surface 461 of the second conductive element 46 is smaller than the size of the cross section of the maximum portion 463 of the second conductive element 46.

Then, a first protective layer 28 and a second protective layer 29 are respectively formed or disposed on the first surface 31 and the second surface 32 of the dielectric layer 3, thus obtaining the substrate 1 as shown in FIGS. 1 and 2. The first protective layer 28 is disposed on the first surface 31 of the dielectric layer 3 and covers at least a portion of the first circuit layer 4. The second protective layer 29 is disposed on the second surface 32 of the dielectric layer 3 and covers at least a portion of the second circuit layer 5. The first and second protective layers 28 and 29 may be made of a solder resist material, for example, BCB or PI. The materials of the first and second protection layers 28 and 29 may be the same or different from each other.

Figure 20:
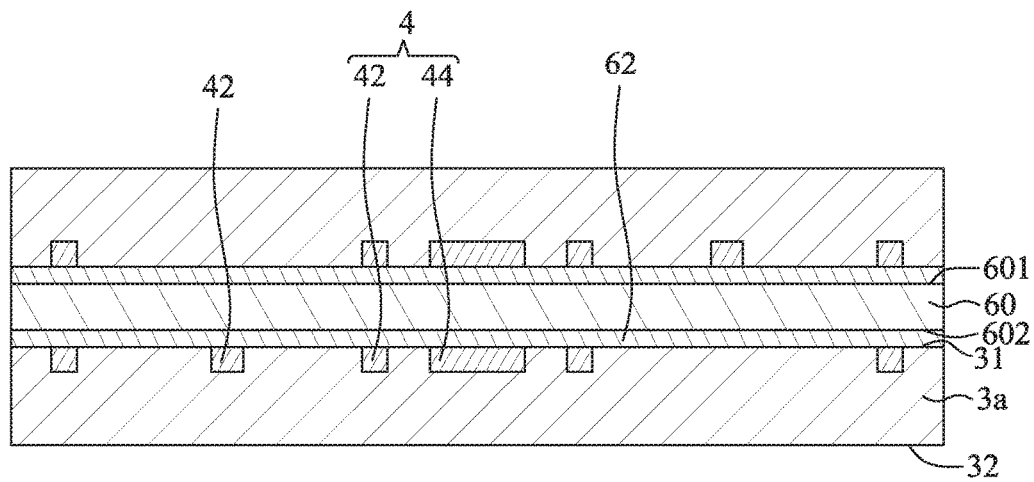
FIG. 20 illustrates one or more stages of an example of a method for manufacturing a substrate according to some embodiments of the present disclosure.

FIG. 20 to FIG. 28 illustrate a method for manufacturing a substrate according to some embodiments of the present disclosure. In some embodiments, the method is for manufacturing a substrate such as the substrate 1a shown in FIG. 4. The initial stages of the illustrated process are the same as the stages illustrated in FIG. 8 and FIG. 9. FIG. 20 depicts a stage subsequent to that depicted in FIG. 9. Referring to FIG. 20, a dielectric layer 3a is formed or disposed on and covers the first metal layer 62 and the first circuit layer 4 thereon. The dielectric layer 3a is made of a photo-imageable dielectric material, such as epoxy or PI including photoinitiators. The dielectric layer 3a includes a first surface 31 and a second surface 32. The first surface 31 of the dielectric layer 3a is disposed on the first metal layer 62. As shown in FIG. 20, the first circuit layer 4 is disposed adjacent to the first surface 31 of the dielectric layer 3a. For example, the first circuit layer 4 is embedded in the dielectric layer 3a and exposed from the first surface 31 of the dielectric layer 3a.

Figure 21:
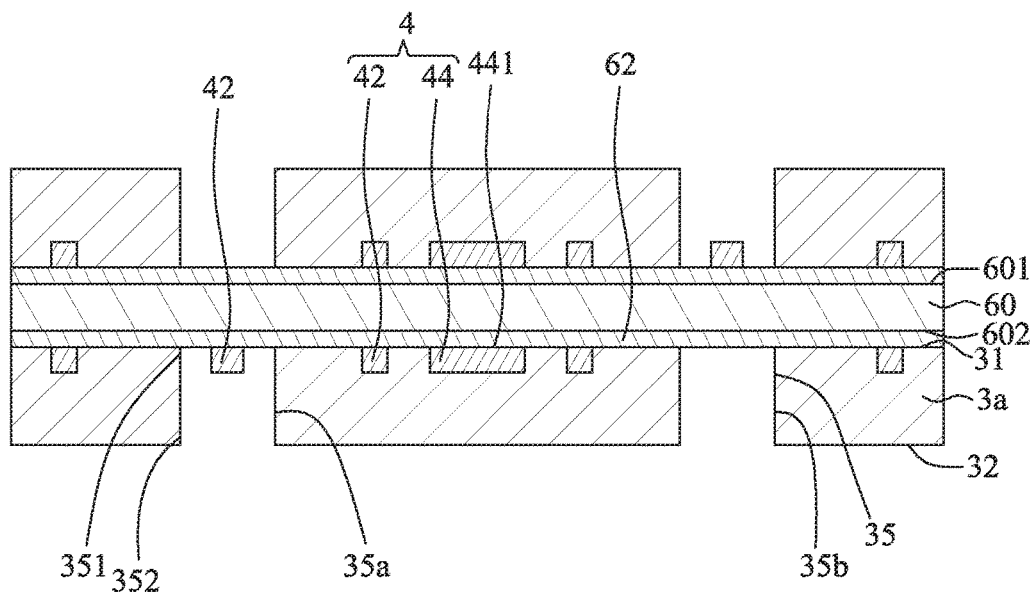
FIG. 21 illustrates one or more stages of an example of a method for manufacturing a substrate according to some embodiments of the present disclosure.

Referring to FIG. 21, a plurality of through holes 35 are formed by, for example, a lithography technique. Each through hole 35 extends through the dielectric layer 3a. Each through hole 35 includes an upper portion 351 adjacent to the first surface 31 of the dielectric layer 3a, and an area of a cross section of the upper portion 351 is substantially equal to an area of an upper surface 441 of the first conductive element 44. Portions of the first metal layer 62 are exposed in the through holes 35. As shown in FIG. 21, a portion (e.g., second section 424) of the trace 42 may be exposed in at least one of the through holes 35. Each through hole 35 further includes a lower portion 352 adjacent to the second surface 32 of the dielectric layer 3a, and a size and a shape of the cross section of the lower portion 352 are substantially the same as the size and the shape of the cross section of the upper portion 351. For example, the through hole 35 has a substantially consistent width/diameter throughout.

Figure 22:
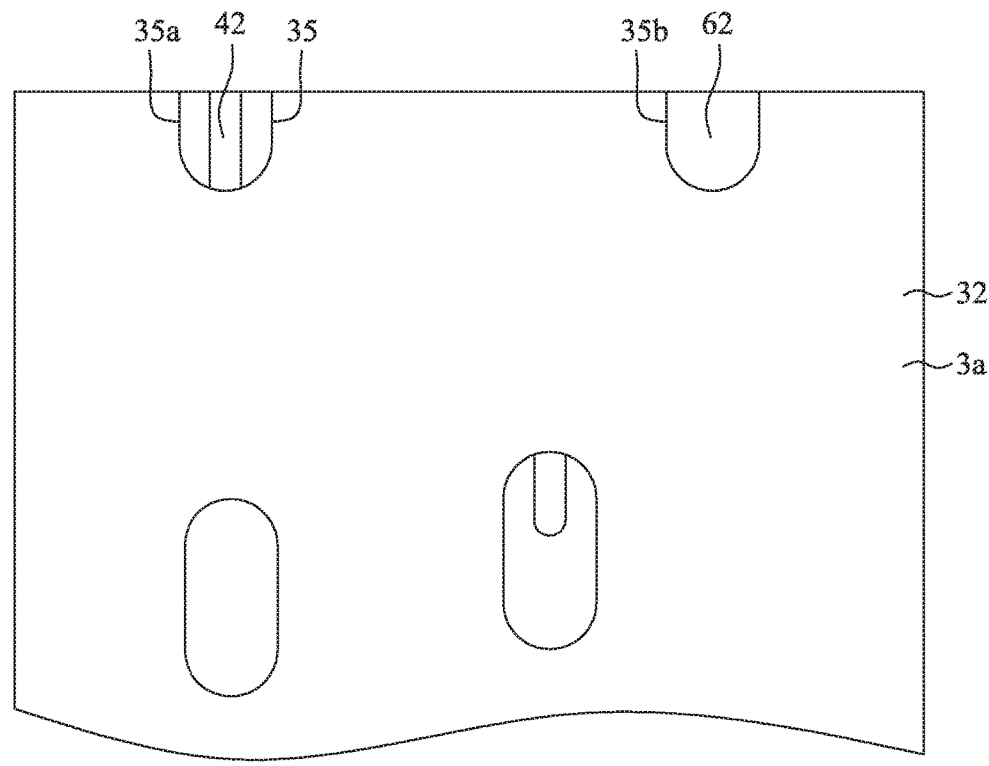
FIG. 22 illustrates one or more stages of an example of a method for manufacturing a substrate according to some embodiments of the present disclosure.

FIG. 22 illustrates a bottom view of the dielectric layer 3a, the trace 42 and the first metal layer 62. As shown in FIGS. 21 and 22, one of the through holes 35 (e.g., the through hole 35a) overlaps the trace 42 of the first circuit layer 4. Another one of the through holes 35 (e.g., the through hole 35b) does not overlap the trace 42 of the first circuit layer 4.

Figure 23:
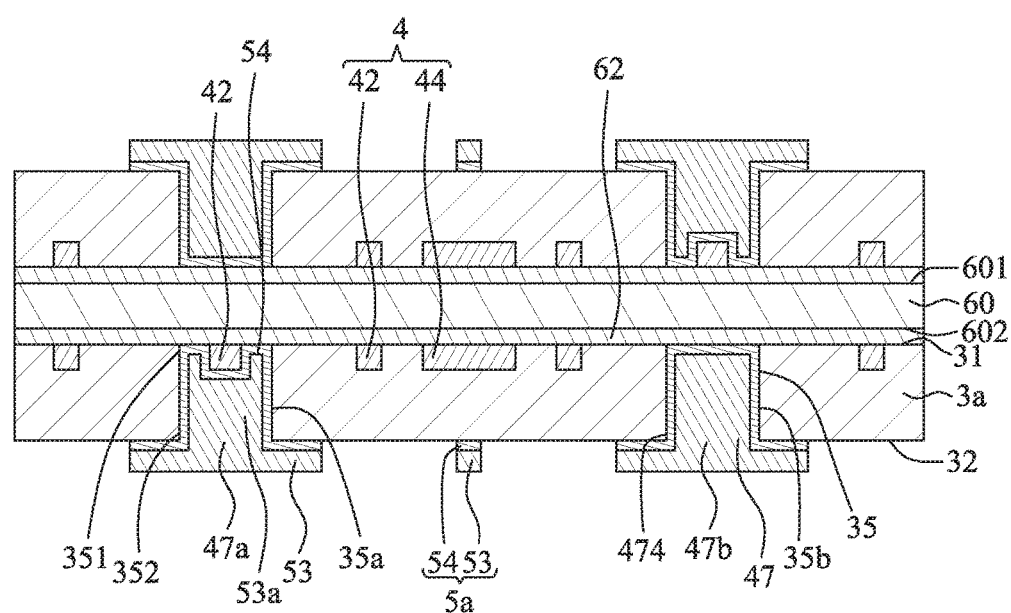
FIG. 23 illustrates one or more stages of an example of a method for manufacturing a substrate according to some embodiments of the present disclosure.

Referring to FIG. 23, the through holes 35 are filled with a conductive material such as a seed layer 54 and a conductive metal 53a, so as to form at least one second conductive element 47. In some embodiments, a second circuit layer 5a is concurrently formed or disposed on the second surface 32 of the dielectric layer 3a. For example, the seed layer 54 is formed or disposed in the through holes 34 of the dielectric layer 3a and on the second surface 32 of the dielectric layer 3a. The seed layer 54 is formed or disposed before filling the through holes 35 with the conductive metal 53a and forming the second circuit layer 5a on the second surface 32 of the dielectric layer 3a. The seed layer 54 may be, for example, titanium and/or copper, and may be formed or disposed by sputtering. Then, a conductive metal 53a, such as copper, is filled in the through holes 35 of the dielectric layer 3a to form the second conductive elements 47 and concurrently form a patterned metal layer 53 on the seed layer 54. For example, the conductive metal 53a and the patterned metal layer 53 are formed or disposed integrally. The patterned metal layer 53 covers portions of the seed layer 54, while other portions of the seed layer 54 remain exposed. Then, the exposed portions of the seed layer 54 are removed by, for example, etching. The second circuit layer 5a is thus formed and includes the seed layer 54 and the patterned metal layer 53.

Accordingly, the at least one second conductive element 47 includes a second conductive element 47a (e.g., formed or disposed in the through hole 35a overlapping the trace 42) that is connected to the trace 42 of the first circuit layer 4. In some embodiments, the at least one second conductive element 47 may include a second conductive element 47b (e.g., formed or disposed in the through hole 35b that does not overlap the trace 42) that is not connected to the trace 42 of the first circuit layer 4. Accordingly, the at least one trace 42 of the first circuit layer 4 may include a trace 42 having an end connected to the first conductive element 44 and another end connected to the second conductive element 47.

Figure 24:
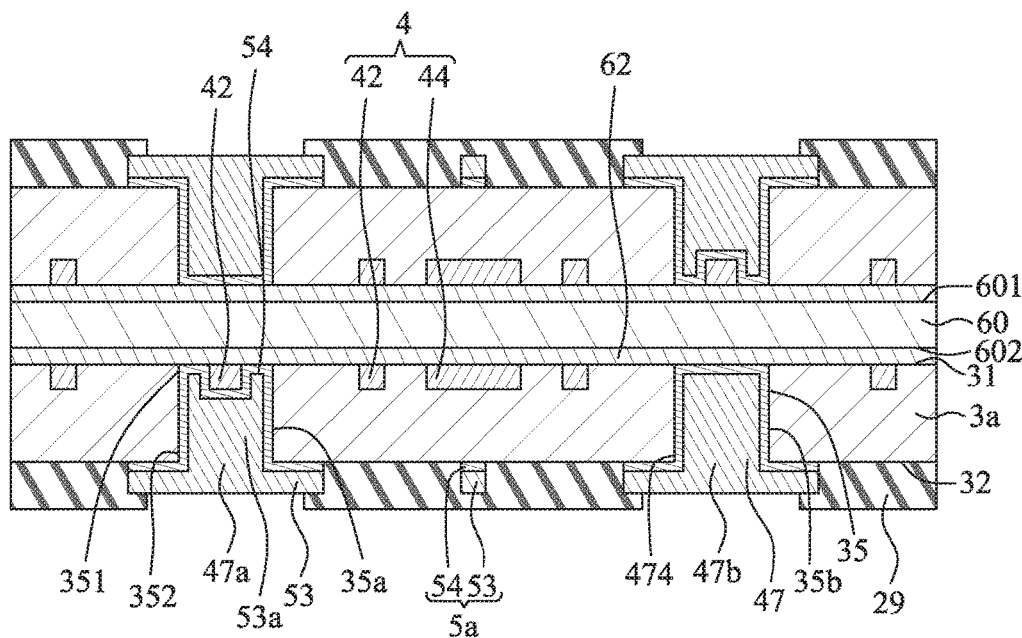
FIG. 24 illustrates one or more stages of an example of a method for manufacturing a substrate according to some embodiments of the present disclosure.

Referring to FIG. 24, a second protective layer 29 is formed or disposed on the second surface 32 of the dielectric layer 3a. The second protective layer 29 is disposed on the second surface 32 of the dielectric layer 3a and covers at least a portion of the second circuit layer 5a. The second protective layer 29 may be made of a solder resist material, for example, BCB or PI.

Figure 25:
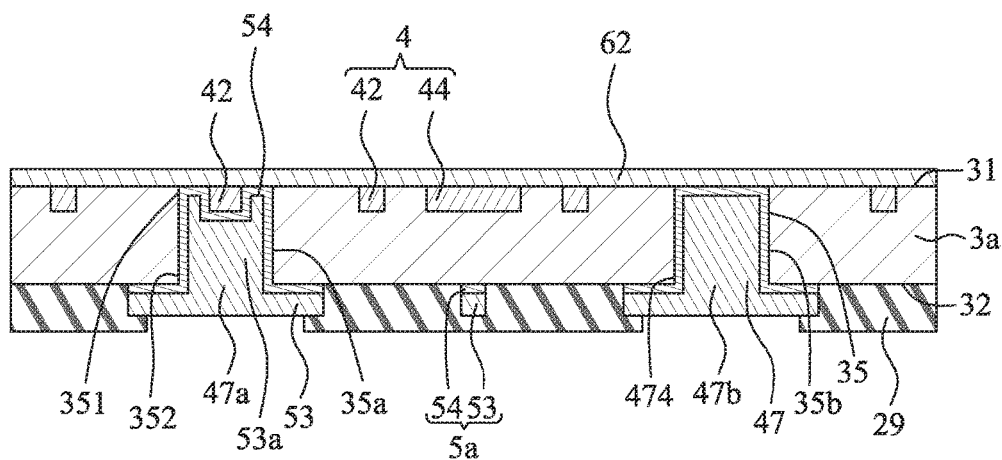
FIG. 25 illustrates one or more stages of an example of a method for manufacturing a substrate according to some embodiments of the present disclosure.

Referring to FIG. 25, the carrier 60 is removed from the first metal layer 62, thereby providing two substrates, one of which is shown in FIG. 25.

Figure 26:
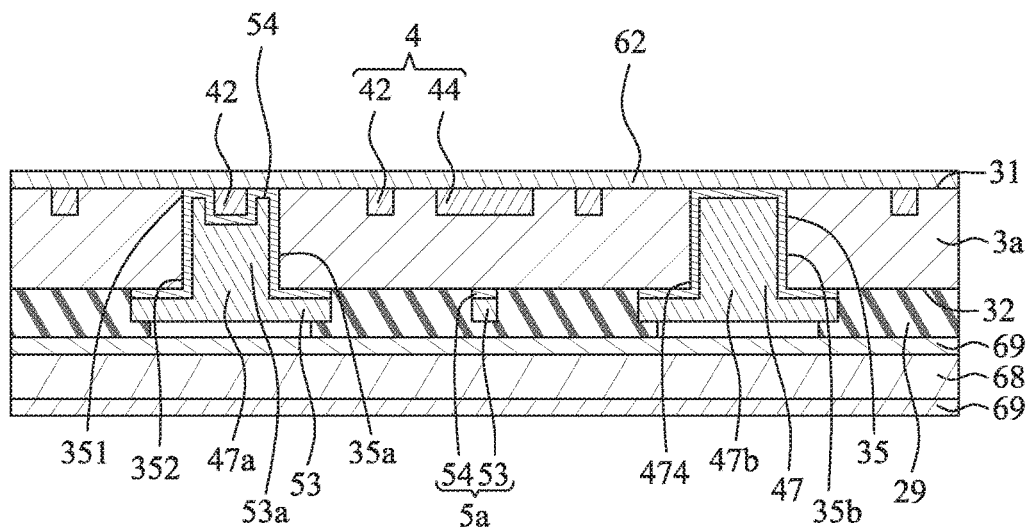
FIG. 26 illustrates one or more stages of an example of a method for manufacturing a substrate according to some embodiments of the present disclosure.

Referring to FIG. 26, since the dielectric layer 3a is made of PID materials, which is rather soft and tends to warp, a second carrier 68 is optionally attached to the second protective layer 29. The carrier 68 may be the same as the carrier 60, and may also include two metal layers 69 on two opposite surfaces of the carrier 68.

Figure 27:
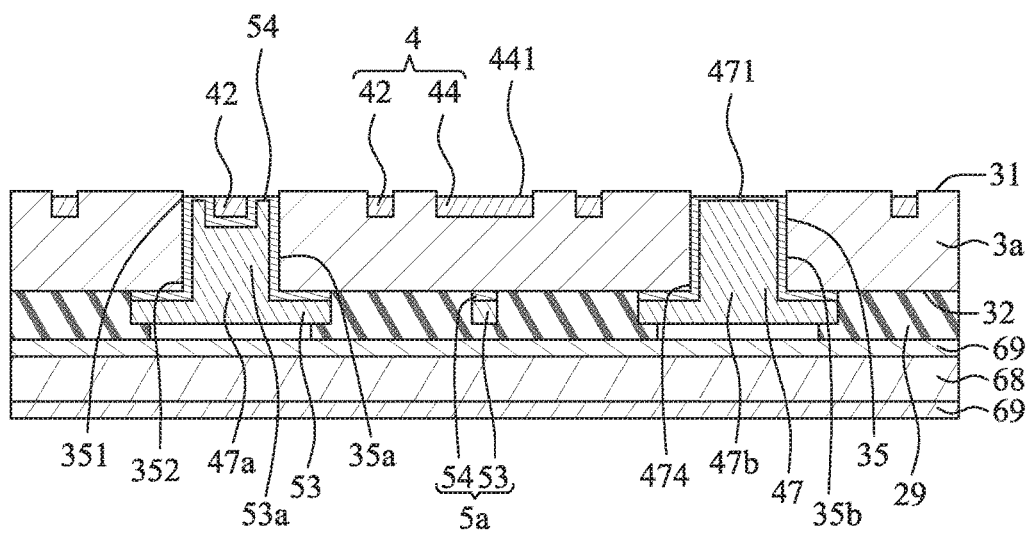
FIG. 27 illustrates one or more stages of an example of a method for manufacturing a substrate according to some embodiments of the present disclosure.

Referring to FIG. 27, the first metal layer 62 is removed (e.g., by etching or grinding) until the first surface 31 of the dielectric layer 3a is exposed, forming the upper surface 441 of the first conductive element 44 and the upper surface 471 of the second conductive element 47 adjacent to the first surface 31 of the dielectric layer 3a. In the case that the first metal layer 62 is removed by etching, the first circuit layer 4 and the second conductive element 47 may be slightly recessed from the first surface 31 of the dielectric layer 3a. For example, the upper surface 441 of the first conductive element 44 and the upper surface 471 of the second conductive element 47 may be slightly lower than the first surface 31 of the dielectric layer 3a.

Since the area of a cross section of the upper portion 351 of the through hole 35 is substantially equal to the area of the upper surface 441 of the first conductive element 44 of the first circuit layer 4, an area of the upper surface 471 of the second conductive element 47 is substantially equal to the area of the upper surface 441 of the first conductive element 44. In some embodiments, a shape and a size of the upper surface 471 of the second conductive element 47 is substantially equal to a shape and a size of the upper surface 441 of the first conductive element 44. In other words, the upper surface 471 of the second conductive element 47 is substantially congruent to the upper surface 441 of the first conductive element 44.

Since the size and the shape of the cross section of the lower portion 352 of the through hole 35 is substantially the same as the size and the shape of the cross section of the upper portion 351, the second conductive element 47 may include a lower portion 474 having a cross section with a size and a shape substantially the same as the size and the shape of the upper surface 471 of the second conductive element 47.

Figure 28:
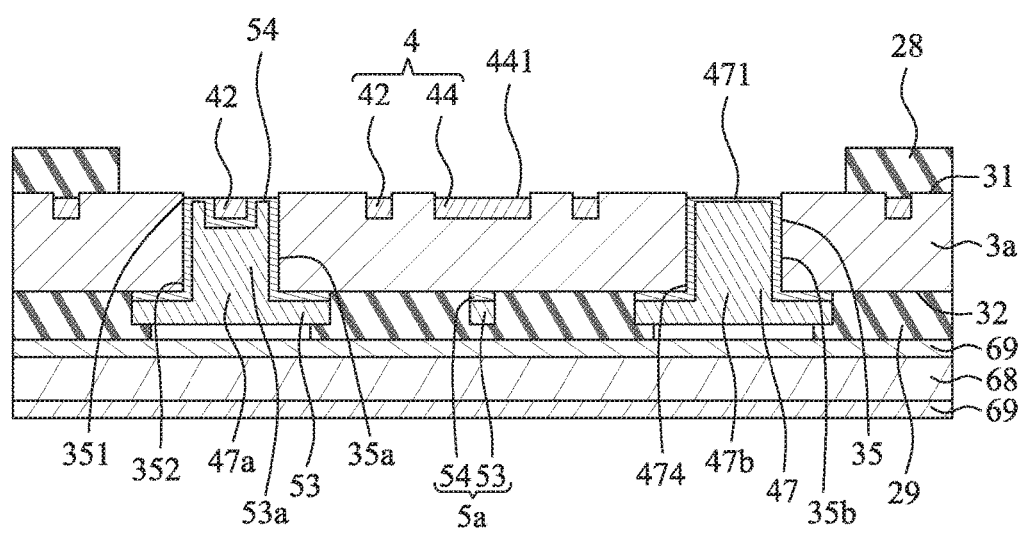
FIG. 28 illustrates one or more stages of an example of a method for manufacturing a substrate according to some embodiments of the present disclosure.

Referring to FIG. 28, a first protective layer 28 is formed or disposed on the first surface 31 of the dielectric layer 3a. The first protective layer 28 is disposed on the first surface 31 of the dielectric layer 3a and covers at least a portion of the first circuit layer 4. The first protective layer 28 may be made of a solder resist material, for example, BCB or PI. The materials of the first and second protection layers 28 and 29 may be the same or different from each other. Then, the second carrier 68 with the metal layers 69 may be removed (if applicable), forming the substrate 1a as shown in FIG. 4.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate, comprising:
a dielectric layer having a first surface and a second surface opposite to the first surface;
a first circuit layer disposed adjacent to the first surface of the dielectric layer, and including at least one trace and at least one first conductive element connected to the trace, wherein the first conductive element does not extend through the dielectric layer; and
at least one second conductive element extending through the dielectric layer, wherein an area of an upper surface of the second conductive element is substantially equal to an area of an upper surface of the first conductive element.

2. The substrate of claim 1, wherein the first circuit layer is embedded in the dielectric layer and exposed from the first surface of the dielectric layer.

3. The substrate of claim 1, wherein the first conductive element includes a bump pad and the second conductive element includes a conductive via.

4. The substrate of claim 1, wherein a shape and a size of the upper surface of the second conductive element are substantially the same as a shape and a size of the upper surface of the first conductive element.

5. The substrate of claim 1, wherein the second conductive element is a monolithic structure and the upper surface of the second conductive element is exposed from the first surface of the dielectric layer.

6. The substrate of claim 1, wherein the upper surface of the second conductive element is substantially coplanar with the upper surface of the first conductive element.

7. The substrate of claim 1, further comprising a second circuit layer disposed on the second surface of the dielectric layer, wherein the second circuit layer is integral with and connected to the second conductive element.

8. The substrate of claim 7, wherein the second circuit layer includes a patterned metal layer, a seed layer and a mask layer, and the seed layer and the mask layer are interposed between the patterned metal layer and the dielectric layer.

9. The substrate of claim 8, wherein the mask layer contacts the dielectric layer and defines at least one opening, and a size of the opening of the mask layer is smaller than a size of a maximum portion of the second conductive element connected to the second circuit layer.

10. The substrate of claim 8, wherein the second conductive element includes a portion of the seed layer and a conductive material disposed on the portion of the seed layer in a through hole of the dielectric layer.

11. The substrate of claim 7, wherein the second conductive element includes a maximum portion connected to the second circuit layer, a shape of a cross section of the maximum portion of the second conductive element corresponds to a shape of the upper surface of the first conductive element, and a size of the cross section of the maximum portion of the second conductive element is greater than a size of the upper surface of the first conductive element.

12. The substrate of claim 7, wherein the second conductive element includes a maximum portion connected to the second circuit layer, and a size of the upper surface of the second conductive element is smaller than a size of a cross section of the maximum portion of the second conductive element.

13. The substrate of claim 1, wherein the at least one second conductive element includes a first portion that is not connected to the trace of the first circuit layer.

14. The substrate of claim 1, wherein the at least one second conductive element includes a second portion that is connected to the trace of the first circuit layer.

15. The substrate of claim 1, wherein the second conductive element includes a longer side and a shorter side, the trace is connected to the shorter side of the second conductive element, the trace includes a first section and a first imaginary interface, the first section is further away from the second conductive element, the first imaginary interface is an imaginary segment of a periphery of the second conductive element and crosses the trace, and a width of the first imaginary interface is greater than a width of the first section of the trace.

16. The substrate of claim 15, wherein the trace further includes a second section within the second conductive element, and a width of the second section of the trace is less than a width of the upper surface of the second conductive element.

17. The substrate of claim 1, wherein the first conductive element includes a longer side and a shorter side, the trace is connected to the shorter side of the first conductive element, the trace includes a first section and a second imaginary interface, the first section is further away from the first conductive element, the second imaginary interface is an imaginary segment of a periphery of the first conductive element and crosses the trace, and a width of the second imaginary interface is greater than a width of the first section of the trace.

18. The substrate of claim 1, wherein the at least one trace of the first circuit layer includes a portion having an end connected to the first conductive element and another end connected to the second conductive element.

19. A semiconductor package, comprising:
a substrate, including:
  a dielectric layer having a first surface and a second surface opposite to the first surface;
  a first circuit layer disposed adjacent to the first surface of the dielectric layer, and including at least one trace and at least one first conductive element connected to the trace, wherein the first conductive element does not extend through the dielectric layer; and
  at least one second conductive element extending through the dielectric layer, wherein an area of an upper surface of the second conductive element is substantially equal to an area of an upper surface of the first conductive element; and
a die, including a plurality of connecting elements, wherein at least one of the connecting elements is electrically connected to the first conductive element, and at least another one of the connecting elements is electrically connected to the second conductive element; and
an encapsulant covering the die and the substrate.

20. The semiconductor package of claim 19, wherein the connecting elements of the die include bonding wires.

21. The semiconductor package of claim 19, wherein the connecting elements of the die include solders.

22. A method for manufacturing a substrate, comprising:
providing a first circuit layer including a trace and a first conductive element connected to the trace;
providing a dielectric layer having a first surface and a second surface opposite to the first surface and covering the first circuit layer, wherein the first circuit layer is disposed adjacent to the first surface of the dielectric layer;
providing a mask layer on the second surface of the dielectric layer, wherein the mask layer defines a plurality of openings;
forming a plurality of through holes in the dielectric layer corresponding to the openings of the mask layer; and
filling the through holes of the dielectric layer with a conductive material and disposing a second circuit layer on the second surface of the dielectric layer.

23. The method according to claim 22, wherein the mask layer is formed of a metal film and the plurality of openings of the mask layer is formed by lithography.

24. The method according to claim 22, further comprising, after forming the through holes of the dielectric layer, forming a seed layer in the through holes and on the mask layer.

25. The method according to claim 24, wherein the seed layer is formed before filling the through holes with the conductive material and disposing the second circuit layer on the second surface of the dielectric layer.

26. The method according to claim 22, wherein one of the through holes overlaps the trace of the first circuit layer, and another one of the through holes does not overlap the trace of the first circuit layer.

27. The method according to claim 26, wherein the one of the through holes that does not overlap the trace of the first circuit layer has an upper portion adjacent to the first surface of the dielectric layer, and an area of a cross section of the upper portion is substantially equal to an area of an upper surface of the first conductive element of the first circuit layer.

28. A method for manufacturing a substrate, comprising:
providing a first circuit layer including a trace and a first conductive element connected to the trace;
providing a dielectric layer having a first surface and a second surface opposite to the first surface and covering the first circuit layer, wherein the first circuit layer is disposed adjacent to the first surface of the dielectric layer, and the dielectric layer is made of a photo-imageable material;
forming a plurality of through holes of the dielectric layer by lithography, wherein each of the plurality of through holes includes an upper portion adjacent to the first surface of the dielectric layer, and an area of a cross section of the upper portion is substantially equal to an area of an upper surface of the first conductive element; and
filling the through holes with a conductive material and disposing a second circuit layer on the second surface of the dielectric layer.

29. The method according to claim 28, further comprising, after forming the through holes of the dielectric layer, forming a seed layer in the through holes and on the dielectric layer.

30. The method according to claim 29, wherein the seed layer is formed before filling the through holes with the conductive material and disposing the second circuit layer on the second surface of the dielectric layer.

31. The method according to claim 28, wherein one of the through holes overlaps the trace of the first circuit layer, and another one of the through holes does not overlap the trace of the first circuit layer.

32. The method according to claim 28, wherein each of the through holes further includes a lower portion adjacent to the second surface of the dielectric layer, and a size and a shape of a cross section of the lower portion are substantially the same as a size and a shape of the cross section of the upper portion.

\* \* \* \* \*